(12) United States Patent
Udagawa et al.

(10) Patent No.: US 6,332,558 B1
(45) Date of Patent: Dec. 25, 2001

(54) CHIP FEEDER AND CHIP FEEDING SYSTEM

(75) Inventors: Akihiro Udagawa, Toyota; Mamoru Tsuda, Okazaki, both of (JP)

(73) Assignee: Fuji Machine Mfg. Co., Ltd., Chiryu (JP)

( * ) Notice: Subject to any disclaimer, the term of this patent is extended or adjusted under 35 U.S.C. 154(b) by 0 days.

(21) Appl. No.: 09/497,149

(22) Filed: Feb. 3, 2000

(30) Foreign Application Priority Data

Feb. 18, 1999 (JP) .................................................. 11-039866

(51) Int. Cl.[7] .............................. B65H 3/60; B67D 5/06; B01F 13/00
(52) U.S. Cl. ............................ 221/200; 221/86; 221/190; 221/202; 221/254; 222/564; 366/193; 366/341
(58) Field of Search ............................... 221/86, 190, 200, 221/202, 204, 254; 222/504; 366/193, 341, 9; 414/415, 375

(56) References Cited

U.S. PATENT DOCUMENTS

| | | | |
|---|---|---|---|
| 559,534 | * | 5/1896 | Lohsand .............................. 221/201 |
| 958,802 | * | 5/1910 | Golden ............................... 221/190 |
| 997,112 | * | 7/1911 | Bridges .............................. 221/190 |
| 1,390,553 | * | 9/1921 | Perreten ............................. 221/190 |
| 1,577,940 | * | 3/1926 | Walker .............................. 221/190 |
| 2,714,973 | * | 8/1955 | Meyer et al. ....................... 221/190 |
| 2,872,055 | * | 2/1959 | Lambert ............................. 414/375 |
| 3,016,166 | * | 1/1962 | Furst ................................. 221/200 |
| 3,097,759 | * | 7/1963 | Jett ................................... 221/190 |
| 3,298,564 | * | 1/1967 | Wheatley et al. ................... 221/201 |
| 4,094,123 | * | 6/1978 | Carlson .............................. 221/200 |
| 4,201,313 | * | 5/1980 | Kirsch ............................... 221/200 |
| 4,457,451 | * | 7/1984 | Ichikawa ............................ 221/190 |
| 4,580,698 | * | 4/1986 | Ladt et al. ............................ 222/55 |
| 4,741,428 | * | 5/1988 | Taniguchi et al. .................. 221/200 |
| 4,801,044 | * | 1/1989 | Kubota et al. ...................... 221/163 |
| 4,872,760 | * | 10/1989 | Arbeniev et al. ..................... 366/7 |
| 4,917,562 | * | 4/1990 | Coli et al. .......................... 414/420 |
| 4,960,229 | * | 10/1990 | Dumbaugh .......................... 222/161 |
| 5,029,727 | * | 7/1991 | Wu .................................... 221/192 |
| 5,054,363 | * | 10/1991 | Scharch ................................ 86/47 |
| 5,269,440 | * | 12/1993 | Bohnert et al. ..................... 221/200 |
| 5,393,053 | * | 2/1995 | Wiese et al. ......................... 273/34 |
| 5,579,951 | * | 12/1996 | Revelle et al. ....................... 221/95 |
| 5,605,400 | * | 2/1997 | Kojima .............................. 366/339 |
| 6,062,423 | * | 5/2000 | Saito et al. ......................... 221/236 |
| 6,098,838 | * | 8/2000 | Saho et al. ......................... 221/163 |
| 6,145,708 | * | 11/2000 | Schmidt ............................. 222/196 |
| 6,152,283 | * | 11/2000 | Kondo et al. ....................... 198/396 |

FOREIGN PATENT DOCUMENTS

06024542A * 2/1994 (JP) ..................................... 221/200

* cited by examiner

Primary Examiner—Christopher P. Ellis
Assistant Examiner—Jeffrey A. Shapiro
(74) Attorney, Agent, or Firm—Oliff & Berridge PLC

(57) ABSTRACT

A chip feeder for feeding chips stored in bulk in a case thereof, one by one, from a chip-supply portion thereof, the chip feeder including a partition plate which parts an inner space of the case into a plurality of rooms, the partition plate having an opening which extends in a direction intersecting a horizontal plane and which communicates the respective rooms on both sides of the partition plate, with each other, a movable partition member which extends across the opening of the partition plate and which is movable relative to the opening in the direction intersecting the horizontal plane, and a movable-partition-member control device which controls the movable partition member so that a lower portion of the movable partition member sinks in an upper portion of a mass of the chips stored in bulk in the case and an upper portion of the movable partition member projects upward from the mass of the chips.

15 Claims, 12 Drawing Sheets

CHIP FEEDER AND CHIP FEEDING SYSTEM

BACKGROUND OF THE INVENTION

1. Field of the Invention

The present invention relates to a chip feeder and a chip supplying system and particularly to the art of preventing chips from being damaged.

2. Related Art Statement

A chip feeder is used for, e.g., supplying electric components ("ECs") in the form of chips, to an electric-component ("EC") mounting system. A chip feeder known as a "bulk" feeder stores a number of "leadless" ECs that have no lead wires, in a loose state, i.e., in bulk in a case thereof, and supplies the ECs, one by one, from an EC-supply portion thereof. There is known an EC supplying system which includes (a) a plurality of bulk feeders which are provided on a table such that respective EC-supply portions of the bulk feeders are arranged along a line (e.g., a straight line, or a curved line such as an arc); and (b) a table moving device which moves the table in a direction parallel to the above line, to position sequentially the respective EC-supply portions of the bulk feeders at a predetermined EC-supply position.

However, the above-indicated EC supplying system has a problem that when the table starts, or stops, moving, the EC chips move, in the case, like a wave because of inertia and may be damaged. The EC chips present in a lower portion of the mass of EC chips stored in bulk in the case are engaged with one another and accordingly can hardly move. On the other hand, the EC chips present in an upper portion of the mass of EC chips can easily move so that the EC chips may collide with one another or the walls of the case, or may be subjected to friction with one another. Thus, the EC chips may be damaged. For example, the surfaces of electrodes of an EC chip may be blackened, which lowers the wettability of the electrodes that is important when the EC chip is soldered to a circuit substrate such as a printed circuit board. Thus, the soldering of the EC ship to the circuit substrate may fail.

In the above-indicated background, it has been practiced that one or more partition plates are provided in the case to part an inner space of the case into a plurality of narrow rooms with respect to a direction parallel to the direction of movement of the table. With the partition plates, the movement of the EC chips in the case can be limited, without having to decreasing the overall width of the inner space of the case (i.e., the dimension of the inner space in the direction parallel to the direction of movement of the table). In the case, the EC chips are stored in the narrow room defined by, and between, each pair of adjacent partition plates, or one partition plate and its adjacent wall surface of the case, so that the movement of the EC chips is effectively limited. Thus, even if the EC chips may move because of inertia, the maximum velocity or kinetic energy of the EC chips can be decreased, so that the EC chips may be prevented from being damaged because of collision with one another or the walls of the case.

However, there are some cases where the damaging of EC chips cannot be effectively prevented even though one or more partition plates may be provided in the case. With the partition plates, the inner space of the case is parted into a plurality of rooms. However, if the case has only a single outlet through which the EC chips are discharged, the case needs a communication passage which communicates the plurality of rooms with each other and which permits all the EC chips to be moved to one of the rooms that communicates with the outlet and be discharged through the outlet. To this end, each of the partition plates is formed with an opening which communicates the two rooms on both sides of the each plate, with each other. However, the opening of each partition plate cannot limit the movement of the EC chips, so that when the table moves, the EC chips may collide, with a great kinetic energy, with one another or the walls of the case, or may be subjected to friction with one another. This may lead to damaging so heavily the EC chips, e.g., blackening the electrodes of the EC chips, that the soldering of the EC chips may fail.

While the foregoing explanation relates to EC chips, chips other than ECs may be damaged for the same reason as described above.

SUMMARY OF THE INVENTION

The present invention provides a chip feeder and a chip supplying system which have one or more of the technical features that are described below in respective paragraphs given parenthesized sequential numbers (1) to (15). Any technical feature which includes another technical feature shall do so by referring, at the beginning, to the parenthesized sequential number given to that technical feature. Thus, two or more of the following technical features may be combined, if appropriate. Each technical feature may be accompanied by a supplemental explanation, as needed. However, the following technical features and the appropriate combinations thereof are just examples to which the present invention is by no means limited.

(1) According to a first feature of the present invention, there is provided a chip feeder for feeding chips stored in bulk in a case thereof, one by one, from a chip-supply portion thereof, the chip feeder comprising at least one partition plate which parts a space in the case into a plurality of rooms, the partition plate having an opening which extends in a direction intersecting a horizontal plane and which communicates the respective rooms on both sides of the partition plate, with each other; at least one movable partition member which extends across the opening of the at least one partition plate and which is movable relative to the opening in the direction intersecting the horizontal plane; and a movable-partition-member control device which controls the movable partition member so that a lower portion of the movable partition member sinks in an upper portion of a mass of the chips stored in bulk in the case and an upper portion of the movable partition member projects upward from the mass of the chips. The chips are not limited to "leadless" ECs and may be various chips for various uses and applications, such as parts of a machine. Since the space in the case is parted by the partition plate into a plurality of rooms, many chips cannot move a great distance even if the chip feeder may be accelerated or decelerated and the upper portion of the mass of chips stored in bulk in the case may move like a wave. Though the two rooms on both sides of the partition plate communicate with each other via the opening and some chips can move between the two rooms via the opening, the chips in the upper portion of the mass of chips are effectively prevented from moving by the movable partition member, and accordingly those chips cannot move a great distance like the chips that are not aligned with the opening. Since the lower portion of the movable partition member sinks in the upper portion of the mass of chips and the upper portion of the same projects from the mass of chips, the movable partition member can prevent the movement of the chips present in a portion of the mass of chips that corresponds to the depth of sinking of the movable partition member in the mass of chips. Thus, each chip cannot move with a great kinetic energy, so that the each chip is prevented from being damaged by collision with the other chips or the walls of the case. As the chip feeder continues to supply the chips and the level of the upper surface of the mass of chips gradually decreases, the level of the movable partition member also gradually decreases to follow the upper surface of the mass of chips. Thus, even if the number of the chips remaining in the case may decrease, the movable partition member maintains its chip-movement limiting effect. The amount of sinking of the movable partition member in the mass of chips can be so pre-set as to limit effectively the movement of the chips, depending upon the shape, size, and/or specific gravity of the chips. For example, the amount may be set at about one second, two thirds, three fourths, or four fifths of the overall volume of the movable partition member. It is desirable that the opening of the partition plate have a shape which allows the chips to move between the two rooms on both sides of the partition plate until all the chips are supplied. Though it is desirable that the movable partition member continue to limit the waving of the chips until all the chips are supplied, it is also desirable that the movable partition member continue to allow the chips to move via the opening between the two rooms on both sides of the partition plate. Thus, it is desirable that the respective shapes and sizes of the movable partition member and the opening be selected in view of the above-indicated factors. In addition, it is possible to employ a lower-end-position defining device which defines a lower end position of the movable partition member. For example, as will be described in connection with the preferred embodiments of the invention, a cord is connected to the movable partition member and is used to lift up the partition member. In this example, the lower end position of the movable partition member may be defined by selecting the length of the cord. Alternatively, the lower end position of the movable partition member may be defined by butting of the partition member on a bottom surface of the case. In the latter example, the lower end position of the movable partition member may be adjusted by selecting the respective shapes and respective sizes of the case and partition member.

(2) According to a second feature of the present invention that includes the first feature (1), the opening of the partition plate extends upward from a lower end thereof. According to this feature, the opening does not reach the upper end of the partition plate. Accordingly, the partition member is not separated into two separate parts by the provision of the opening. Therefore, the partition plate can be easily provided in the case. The opening may be one which does not reach any ends or edges of the partition plate and which communicates the two rooms on both sides of the partition plate with each other. In this manner, however, the chips located below the opening could not move between the two adjacent rooms and might be left in the case without being discharged therefrom. In contrast thereto, the opening extending upward from the lower end of the partition plate allows the chips to move between the two adjacent rooms even if the number of the chips may be decreased near to zero.

(3) According to a third feature of the present invention that includes the first or second feature (1) or (2), the movable partition member has two grooves which are formed in opposite end surfaces of the movable partition member, respectively, such that each of the two grooves extends in the direction intersecting the horizontal plane, and the partition plate has two opposed edges which are opposed to each other to define the opening therebetween and which are fitted in the two grooves of the movable partition member, respectively, so that the movable partition member is slideable on the opposed edges defining the opening. The movable partition member may be a plate-like one having a predetermined thickness, or one including opposite thick end portions having the opposite end surfaces or the two grooves, respectively, and an intermediate thin portion located between the two thick end portions. The two grooves may be formed in the two opposed edges of the partition plate that define the opening. In this manner, however, the partition plate needs to have an increased thickness, which decreases the maximum volume of the chips that can be stored in the case. In the manner in which only the two opposed edges of the partition plate are thickened and the two grooves are formed in the thickened edges, the decrease of the maximum volume of the chips can be reduced. In the latter manner, however, the cost to work the partition plate is increased. According to the third feature (3), the partition plate can be fitted in the two, grooves of the movable partition member, at low cost, without decreasing the capacity of the case to store the chips. The fitting of the two opposed edges of the partition plate in the two grooves of the movable partition member enables the movable partition member to move while being guided by the opposed edges, and positions the movable partition member in two directions which are perpendicular to the direction of movement thereof and to each other. Thus, the two grooves and the two opposed edges cooperate with each other to provide a guide device which guides the movable partition member when the partition member moves.

(4) According to a fourth feature of the present invention that includes any one of the first to third features (1) to (3), the movable-partition-member control device comprises the movable partition member which has a specific gravity smaller than a specific gravity of the mass of the chips stored in bulk in the case so that the movable partition member floats on the mass of the chips in a state in which the lower portion of the movable partition member sinks in the upper portion of the mass of the chips. The movable-partition-member control device may be one which includes a level detector which detects a level (i.e., height position) of the upper surface of the mass of chips stored in bulk in the case, and a movable-partition-member drive device which moves the movable partition member to a height position corresponding to the level of the upper surface detected by the level detector. In contrast, according to the fourth feature (4), the movable-partition-member control device can be provided at very low cost. The specific gravity of the mass of the chips is defined as not a pure specific gravity of the chips but an average or apparent specific gravity of the mass including the chips and the small gaps present among the chips. In the manner in which the movable partition member is provided by a solid member, the solid member needs to be formed of a material whose specific gravity is smaller than that of the mass of the chips. On the other hand, in the manner in which the movable partition member is provided by a hollow member having an inner hollow space, the hollow member need not be formed of a material whose specific gravity is smaller than that of the mass of the chips, and an average or apparent specific gravity of the hollow member including the inner hollow space needs to be smaller than that of the mass of the chips. The specific gravity and material of the movable partition member are selected depending upon the sort of the chips. For example, in the case where the chips are ECs each of which includes metallic electrodes and a main body formed of a nonconductive material (e.g., ceramic material), the movable partition member is formed of, e.g., a synthetic resin. The partition member may be provided by a solid member formed of a synthetic resin, or a synthetic resin mixed with a metallic powder, or by a hollow member which, if the specific gravity thereof is insufficiently low, may be filled with a metallic powder. The solid member may be formed of a metal such as aluminum, and the hollow member may be formed of, e.g., a steel. It is desirable that the specific gravity of the movable partition member be changeable. For example, a plurality of sorts of movable partition plates having different specific gravities are prepared, and one of those partition plates is selected and used, based on the amount of sinking of each partition member in the mass of chips, in such a way that the specific gravity of the selected partition member causes a lower portion thereof to sink appropriately in an upper portion of the mass of chips and thereby limit the movement of the chips and causes an upper portion thereof to project appropriately upward from the mass and thereby prevent the chips from moving thereover. The hollow movable partition member may be provided with a mouth which is usually closed by a closing member such as a plug or a cover and which is used to charge or discharge a filler such as a metallic powder into the inner hollow space of the member, as needed, and thereby adjust the specific gravity of the member.

(5) According to a fifth feature of the present invention that includes any one of the first to third features (1) to (3), the movable partition member includes at least one projecting portion which projects laterally from a side surface thereof and which has a specific gravity smaller than a specific gravity of the mass of the chips, and the movable-partition-member control device comprises the projecting portion of the movable partition member. The projecting portion of the movable partition member may be formed of a synthetic resin, or a foamed body such as polystyrene foam. Since the apparent specific gravity of the projecting portion is small and accordingly the projecting portion floats on the mass of chips, the movable partition member can be controlled such that the lower portion of the partition member sinks in the upper portion of the mass of chips and the upper portion of the partition member projects upward from the mass of chips. According to the fifth feature (5), a main portion of the movable partition member may be formed of a material whose specific gravity is greater than that of the mass of chips; such as metal, e.g. steel. In the manner in which the movable partition member is formed of metal, the wearing of the partition member due to collision with the chips can be reduced and accordingly the life expectancy of the same is increased.

(6) According to a sixth feature of the present invention that includes any one of the first to fifth features (1) to (5), the case comprises a thin case having a thin space therein, and the partition plate extends, in the thin space of the thin case, in a direction parallel to a lengthwise direction of the thin case to part the thin space into a plurality of thin rooms. The thin space in the thin case is parted into a plurality of thin rooms by the partition plate in a direction parallel to the widthwise direction of the thin case. When the thin case is moved in the widthwise direction thereof while being repeatedly accelerated and decelerated, the partition plate can effectively limit the waving of the chips in each of the thin rooms.

(7) According to a seventh feature of the present invention that includes the sixth feature (6), the chip feeder comprises a plurality of the partition plates which extend parallel to each other in the thin space of the thin case. Even in the manner in which a single partition plate is provided in the thin case, the single partition plate can reduce the kinetic energy of each chip upon vibration of the chip feeder, thereby preventing the each chip from being damaged. However, the more the number of the partition plates is, the more those partition plates can reduce the kinetic energy of each chip, and the more effectively they can prevent the each chip from being damaged.

(8) According to an eighth feature of the present invention that includes the seventh feature (7), the chip feeder further comprises a plurality of connecting plates each of which extends between the plurality of partition plates to connect the partition plates to each other, each of the partition plates having a plurality of first slits each of which extends downward from an upper end of the each partition plate, each of the connecting plates having a plurality of second slits each of which extends upward from a lower end of the each connecting plate, and the first slits of the partition plates and the second slits of the connecting plates are fitted in each other so that the partition plates and the connecting plates are combined with each other. Since the plurality of partition plates are connected to each other by the connecting plates, all of them can be treated as an integral assembly and accordingly can be easily provided in the case. In addition, since the plurality of partition plates are connected to each other by the connecting plates, the plurality of partition plates are held in a state in which the plurality of partition plates are distant from each other. Thus, the connecting plates also function as a positioning device which positions, in the case, the plurality of partition plates at respective positions which are distant from each other. This arrangement contributes to simplifying the structure of the case. The eighth feature (8) may be employed by a chip feeder which does not employ the first feature (1).

(9) According to a ninth feature of the present invention that includes any one of the first to eighth features (1) to (8), the partition plate is provided in the space of the case such that a lower end of the partition plate is supported on a bottom surface of the case. According to this feature, the chips are prevented from being damaged by being pinched between the lower end of the partition plate and the bottom surface of the case. The ninth feature (9) may be employed by a chip feeder which does not employ only one, or both, of the first feature (1) and the eighth feature (8).

(10) According to a tenth feature of the present invention that includes any one of the first to ninth features (1) to (9), the chip feeder further comprises a lifting device which lifts the movable partition member upward to an upper-end position thereof, irrespective of a position of an upper surface of the mass of the chips stored in bulk in the case. The movable partition member is lifted up by the lifting device, e.g., when (either after or before) the case is replenished with new chips.

(11) According to an eleventh feature of the present invention that includes the tenth feature (10), the lifting device comprises an operable member which is movably supported by the case; and a cord which connects the operable member and the movable partition member to each other. The cord may be one which has a flexibility and such a strength that enables the cord to lift up the movable partition member, for example, the cord may be, e.g., a silk gut, a thread, a string, or a chain. Alternatively, the lifting device may be one which includes a rod which is fixed to the movable partition member, extends upward, and projects out of the case. In the latter manner, the partition member is moved up by lifting up the rod. Therefore, the direction in which the projecting end portion of the rod that functions as an operable member is moved is limited. In contrast, according to the eleventh feature (11), the direction in which the operable member is moved can be freely modified by selecting the position where a guide member for guiding the cord is provided. In addition, according to the feature (11), the lifting device can be produced with a simple structure and at a low cost.

(12) According to a twelfth feature of the present invention that includes the eleventh feature (11), the case includes a shutter which is movable to open and close the space of the case, and the operable member of the lifting device comprises the shutter. According to this feature, the movable partition member is lifted up by opening the shutter. Therefore, an operator need not separately perform the shutter opening operation and the movable-partition-member lifting operation. Thus, this arrangement contributes to simplifying the operations of the operator, reducing the total number of parts needed to produce the chip feeder, and simplifying the structure of the case.

(13) According to a thirteenth feature of the present invention that includes any one of the first to twelfth features (1) to (12), the chip feeder further comprises a cushion layer which is provided on a surface of at least one of the partition plate and the movable partition member, the surface being exposed to the space of the case. The cushion layer may be a rubber layer or its analogous layer. According to this feature, each chip is prevented from being damaged when it collides with the partition plate or the movable partition member, because the cushion layer reduces the impact produced upon collision of the each chip. The thirteenth feature (13) may be employed in a chip feeder which does not employ any one of the above-described features.

(14) According to a fourteenth feature of the present invention that includes any one of the first to thirteenth features (1) to (13), the case has an outlet, the chip feeder further comprises a chip-discharge promoting member which is provided in vicinity of the outlet of the case and which is movable up and down to promote discharging of the chips from the case through the outlet thereof, and the partition plate has the opening which is provided above the chip-discharge promoting member to permit the chips to be moved up when the chip-discharge promoting member is moved up. The chip-discharge promoting member may be, as will be described in connection with the preferred embodiments of the invention, provided such that the promoting member is concentric with the outlet, or alternatively provided at a position off-set from the outlet. The chip feeder may employ a plurality of chip-discharge promoting members. Around the outlet, a "bridge" phenomenon may occur that a plurality of chips engage each other and prevent each other from falling into the outlet. Since the chip-discharge promoting member is repeatedly moved up and down, the chips in contact with the promoting member are moved with the promoting member and additionally other chips in contact with those chips are also moved. Thus, the "bridge" phenomenon is avoided, and the chips are smoothly discharged from the case through the outlet. Moreover, since the partition plate has the opening above the promoting member, at least one of each chip, the partition member, and the promoting member are effectively prevented from being damaged, because the each chip is not strongly pinched between the partition member and the promoting member when the promoting member is moved upward.

(15) According to a fifteenth feature of the present invention, there is provided a chip supplying system comprising a table; a plurality of chip feeders, each according to any one of the first to fourteenth features (1) to (14), which are provided on the table such that the respective chip-supply portions of the chip feeders are arranged along a line; and a table moving device which moves the table in a direction parallel to the line to sequentially position each of the respective chip-supply portions of the chip feeders at a predetermined chip-supply position. The line along which the respective chip-supply portions of the chip feeders are arranged may be a straight line, a circle, an arc (i.e., a part-circle), a curved line other than the arc, or any combination of two or more of a straight line, a circle, an arc, and a curved line. In the manner in which the respective chip-supply portions of the chip feeders are arranged along a straight line, the chip feeders are provided on a table which is movable along the straight line. In the manner in which the chip-supply portions of the chip feeders are arranged along a circle, the chip feeders are provided on a circular (i.e., full-circular) table which is rotatable about an axis line. In the manner in which the chip-supply portions of the chip feeders are arranged along an arc, the chip feeders are provided on a sectorial (i.e., part-circular) table which is rotatable about an axis line. Each of the circular table and the sectorial table can be said as a rotary table which is rotatable about an axis line. The chip feeders may be so controlled as to supply the chips only when the table is moved forward in one of opposite directions along the line; not only when the table is moved forward in one of opposite directions along the line but also when the table is moved backward in the other direction; or while the table is freely moved forward and backward in opposite directions along the line. Irrespective of whether the table may be moved in one direction only or in both forward and backward directions, the mass of the chips stored in bulk in the case may move like a wave when the table starts or stops moving. However, since the space in the case is parted by the partition plate and the movable partition member is provided in association with the partition plate, the waving of the chips is effectively limited and the damaging of the same is effectively prevented.

BRIEF DESCRIPTION OF THE DRAWINGS

The above and optional objects, features, and advantages of the present invention will be better understood by reading the following detailed description of the preferred embodiments of the invention when considered in conjunction wit the accompanying drawings, in which.

DETAILED DESCRIPTION OF THE PREFERRED EMBODIMENTS

Hereinafter, there will be described an electric-component ("EC") supplying system 10 embodied as a sort of chip supplying system according to the present invention, by reference to the drawings.

Figure 1:
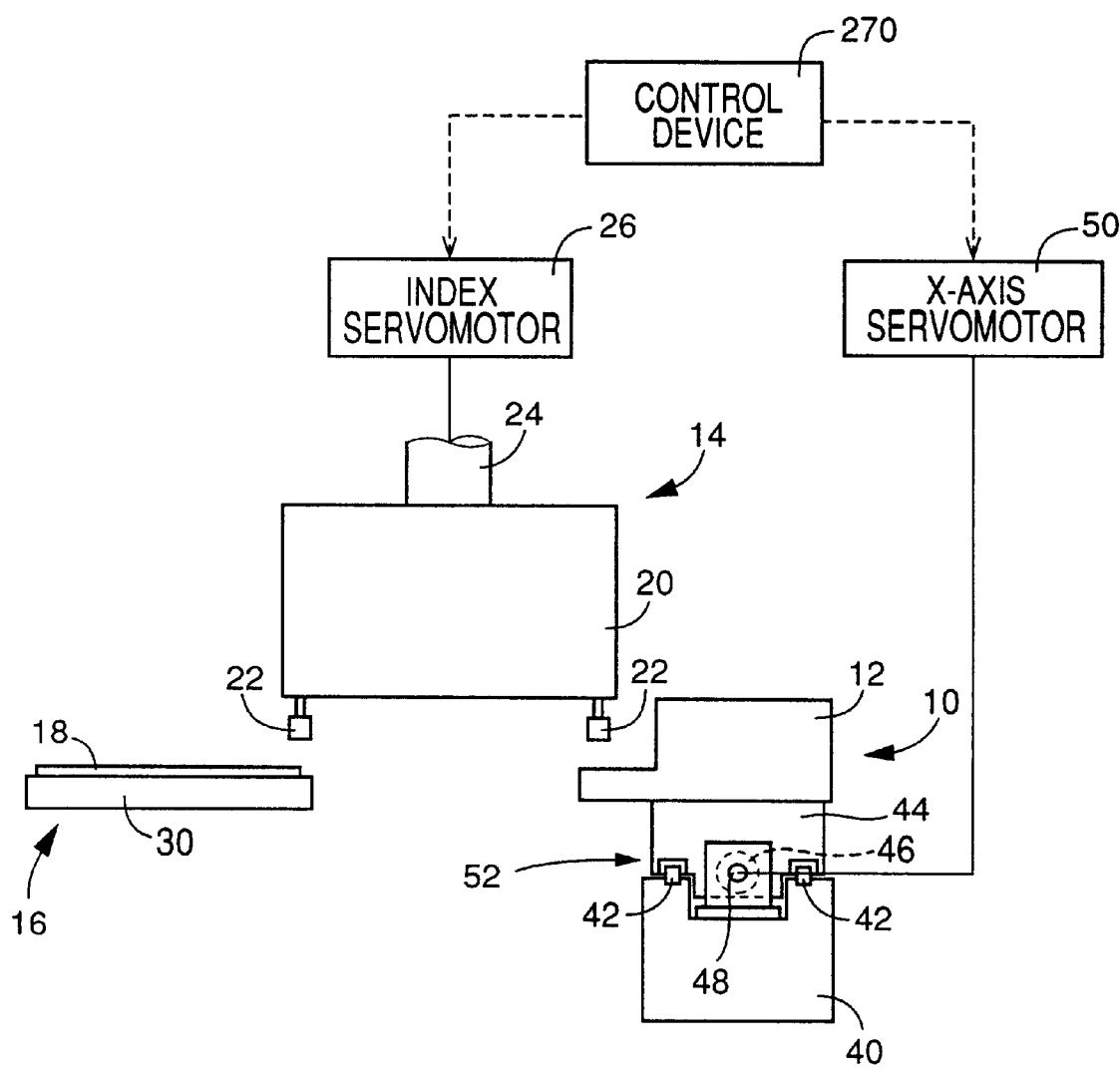
FIG. 1 is a schematic front elevation view of an electric-component ("EC") supplying system to which the present invention is applied and which includes a chip feeder to which the present invention is also applied.

The EC supplying system 10 includes a plurality of chip feeders 12 (however, only one feeder 12 is shown in FIG. 1). Each of the chip feeders 12 can supply electronic components ("ECs") to an EC mounting system 14 as a sort of chip mounting system, or as an EC taking system as a sort of chip taking system. The EC mounting system 14 mounts the ECs on a printed circuit board ("PCB") 18 as a sort of circuit substrate ("CS") that is positioned and supported by a PCB positioning and supporting system 16 as a sort of CS positioning and supporting system. The EC supplying system 10, the EC mounting system 14, and the PCB positioning and supporting system 16 cooperate with one another to provide an EC mounting machine as a sort of chip mounting machine.

The EC mounting system 14 includes an index table 20 which is intermittently rotated about a vertical axis line. The index table 20 has a plurality of (e.g., twelve) EC suction heads 22 each as an EC holder as a sort of chip holder (however, only two heads 22 are shown in FIG. 1). The index table 20 is intermittently rotated by an intermittently rotating device which is provided by a cam and a cam follower (not shown), a rotary shaft 24, an index servomotor 26 which rotates the cam, and other members. Thus, each of the twelve EC suction heads 22 is moved to, and stopped, at each of an EC-suck position, an EC-posture-detect position, an EC-posture-correct position, and an EC-mount position. The index table 20 supports the EC-suction heads 22 such that each of the heads 22 is movable up and down, and two elevating and lowering devices (not shown) are provided at the EC-suck position and the EC-mount position, respectively, to elevate and lower each head 22 stopped thereat. The rotation of the index servomotor 26 is converted by a motion converting device (not shown) provided by a cam, a cam follower, and other members, into upward and downward movements of a vertically movable member (not shown), which cause the upward and downward movements of each EC-suction head 22. Each of the two elevating and lowering devices includes the motion converting device and the movable member.

The PCB positioning and supporting system 16 includes a PCB-support table 30 which positions and supports the PCB 18. The PCB-support table 30 is provided on an X-Y table (not shown) which is movable in an X-axis direction and a Y-axis direction which are perpendicular to each other on a horizontal plane. The X-axis direction is perpendicular to the plane of the sheet of FIG. 1, and the Y-axis direction is parallel to a widthwise direction of the sheet of FIG. 1. The PCB table 18 can be moved to any desired position on the horizontal plane by moving the X-Y table. The PCB 18 is conveyed in a direction parallel to the X-axis direction, is carried in onto the PCB-support table 30 by a PCB carry-in conveyor (not shown), and is carried out from the table 30 by a PCB carry-out conveyor (not shown). In an EC mounting operation, the PCB 18 is moved by the X-Y table so that each of predetermined EC-mount places on the PCB 18 is positioned right below the EC-suction head 22 being stopped at the EC-mount position and the EC held by the head 22 is mounted on the each EC-mount place of the PCB 18.

Next, the EC supplying system 10 will be described.

The EC supplying system 10 includes a base 40 on which a guide device including a pair of guide rails 42 as guide members that extend parallel to each other in the X-axis direction is provided. An X-axis table 44 as a sort of support table is fitted on the guide rails 42 such that the X-axis table 44 is movable in the X-axis direction. The chip feeders 12 are supported on the X-axis table 44 such that respective EC-supply portions of the chip feeders 12 as respective chip-supply portions of the same 12 are arranged along a straight line parallel to the X-axis direction. Each of the chip feeders 12 feeds ECs, one by one, in an EC-feed direction parallel to the Y-axis direction, and supplies, to the EC mounting system 14, the ECs, one by one, from the EC-supply portion thereof. The EC-supply portion of each chip feeder 12 can be said as an EC-take portion thereof from which the ECs are taken, one by one, by the EC mounting system 14 as the EC taking system.

An internally threaded nut 46 is fixed to the X-axis table 44, and is threadedly engaged with an externally threaded feed screw 48 which is provided on the base 40 such that the feed screw 48 is immovable in an axial direction thereof relative to the base 40 and is rotatable about an axis line thereof relative to the same 40. When the feed screw 48 is rotated by an X-axis servomotor 50, the X-axis table 44 is moved in the X-axis direction, so that the EC-supply portion of a selected one of the chip feeders 12 is positioned at a position right below the EC-suction head 22 being positioned at a predetermined EC-supply position as a chip-supply position, that is, the EC-suck position of the index table 20. The nut 46, the feed screw 48, and the X-axis servomotor 50 cooperate with one another to provide a table moving device 52. Each of the X-axis servomotor 50 and the index servomotor 26 is an electric motor as a sort of drive source that is accurately controllable with respect to its rotation angle and speed, and may be replaced with a stepper motor.

Each of the chip feeders 12 will be described below.

Each chip feeder 12 includes a case 62 in which a plurality of "leadless" ECs 60 as a sort of chips that have no lead wires are stored loosely, i.e., in bulk; and an EC feeding device 64 which feeds the ECs 60 from the case 62 to the EC-supply portion of the feeder 12. The EC feeding device 64 has substantially the same construction as that of an EC feeding device of a chip feeder disclosed in U.S. patent application Ser. No. 09/106,703 assigned to the assignee of the present application, and is briefly described below.

Figure 2:
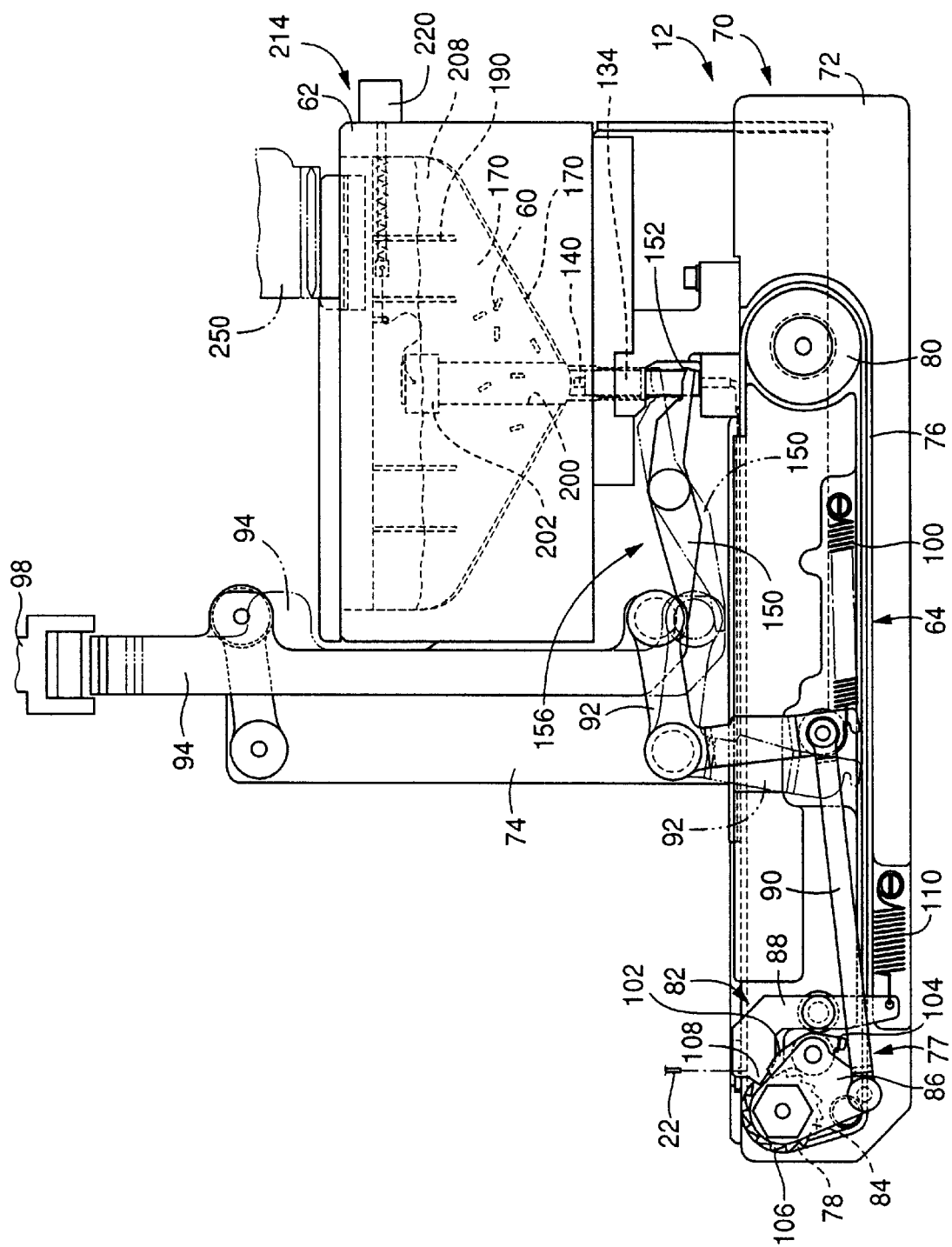
FIG. 2 is a front elevation view of the chip feeder of FIG. 1.

As shown in FIG. 2, the chip feeder 12 includes an integral frame body 70 which is easily manufactured by assembling a plurality of separate members including a first member 72 and a second member 74. The first member 72 has a generally elongate plate-like shape, and a lengthwise direction of the first member 72, i.e., the EC-feed direction is parallel to the Y-axis direction and a widthwise direction of the same 72 is perpendicular to the EC-feed direction and a vertical direction. The respective first members 72 of the chip feeders 12 are upright on the X-axis table 44, such that the respective EC-supply portions of the feeders 12 are arranged along the straight line parallel to the X-axis direction, as described above. The first member 72 is positioned relative to the X-axis table 44, by a positioning device (not shown), in the lengthwise and widthwise directions of the member 72, and is attached to the table 44 by an attaching device (not shown) such that the member 72 does not move off the table 44. The chip feeder 12 can be removed from the X-axis table 44 by releasing the attaching device and thereby detaching the first member 72 from the table 44.

The EC feeding device 64 includes a belt 76 as a feed member, and a belt drive device 77 as a feed-member moving device that drives or moves the belt 76 and thereby moves the ECs 60. The belt drive device 77 includes a drive pulley 78 as a drive rotary member, a driven pulley 80 as a driven rotary member, and a pulley drive mechanism 82 which rotates the drive pulley 78. The drive and driven pulleys 78, 80 are attached to the first member 72, at a front and a rear location, respectively, which are distant from each other in the lengthwise direction of the member 72, such that each of the pulleys 78, 80 is rotatable about an axis line parallel to the widthwise direction of the member 72. The front location is on the side of the EC mounting system 14, that is, on the side of the EC-supply portion of the chip feeder 12, and the rear location is on the side of the case 62. The belt 76 is wound on the pulleys 78, 80. Each of the pulleys 78, 80 is a timing pulley, and the belt 76 is an endless timing belt.

The pulley drive mechanism 82 includes a ratchet wheel 84 formed integrally and concentrically with the drive pulley 78, a first pivotable member 86, a second pivotable member 88, a drive member 90, and a lever 92, and is driven via a link 94 as a driven member which is movable up and down. The link 94 is driven by a vertically movable member 98 as a drive member that is provided at the EC-supply position. More specifically described, the vertically movable member 98 is provided above the link 94 of the chip feeder 12 whose EC-supply portion is positioned at the EC-supply position. Like the movable member to move each EC-suction head 22 up and down, the movable member 98 is moved up and down by a motion converting device (not shown) which includes a cam, a cam follower, and other members and which converts the rotation of the index servomotor 26 into the upward and downward movements of the movable member 98. Thus, the movable member 98 is moved up and down in synchronism with the EC taking operation of each EC-suction head 22.

When one EC-suction head 22 is moved down to take an EC 60 from one chip feeder 12, the movable member 98 is moved down, concurrently with the downward movement of the one head 22, to engage the link 94 of the one feeder 12 and move the same 94 down. When the link 94 is moved down, the lever 92 is pivoted against a biasing force of a tension coil spring 100, the drive member 90 is moved, the first pivotable member 86 is pivoted in a backward direction (i.e., clockwise in FIG. 2), and a drive pawl 102 pivotally attached to the first pivotable member 86 is pivoted in a backward direction over one or more teeth 106 of the ratchet wheel 84 against a biasing force of a spring member 104. Thus, the belt drive device 77 is prepared for moving the belt 76. A backward rotation of the ratchet wheel 84 is inhibited by the engagement of a positioning projection 108 of the second pivotable member 88 with one tooth 106 of the ratchet wheel 84 owing to the biasing of a tension coil spring 110.

After the EC-suction head 22 sucks and holds an EC 60 and moves up to take the EC 60 from the chip feeder 12, the movable member 98 is moved up, so that the link 94 moves up to follow the movable member 98, owing to the biasing of the tension coil spring 100. As a result, the first pivotable member 86 is pivoted in a forward direction (i.e., counter-clockwise in FIG. 2), the drive pawl 102 is rotated in a forward direction, and the ratchet wheel 84 and the drive pulley 78 are rotated in a forward direction. Thus, the belt 76 is moved so that an EC 60 located upstream of the EC-supply portion as seen in the EC-feed direction is fed to the EC-supply portion. The EC-supply portion of each chip feeder 12 includes a position where each EC 60 is taken by each EC-suction head 22 of the EC mounting system 14 in the EC supplying operation. The forward rotation of the ratchet wheel 84 is permitted by the positioning projection 108 because the second pivotable member 88 is pivoted against the biasing force of the tension coil spring 110.

Next, the case 62 will be described.

Figure 3:
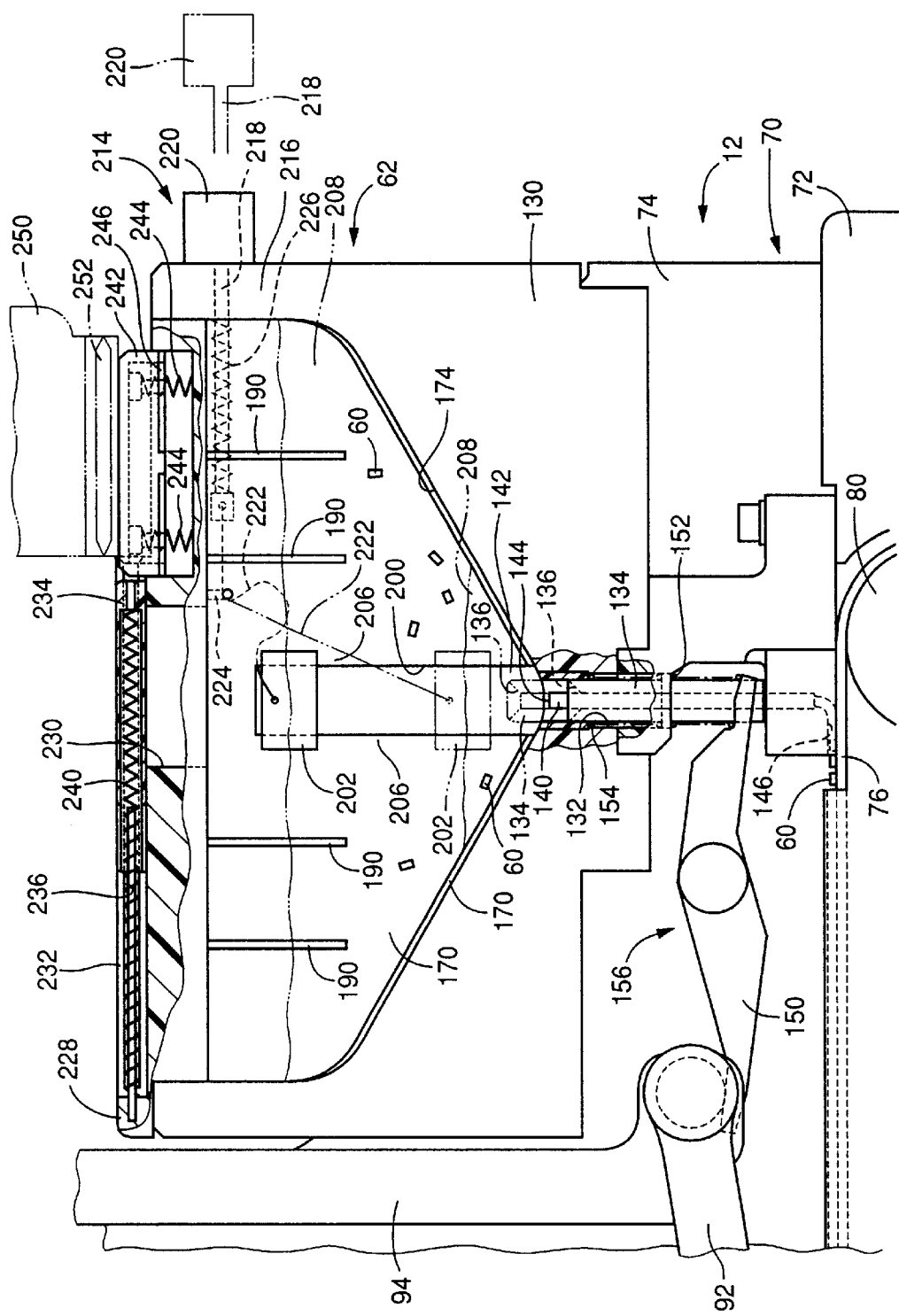
FIG. 3 is a partly cross-sectioned, front elevation view of a case of the chip feeder of FIG. 1.
Figure 4:
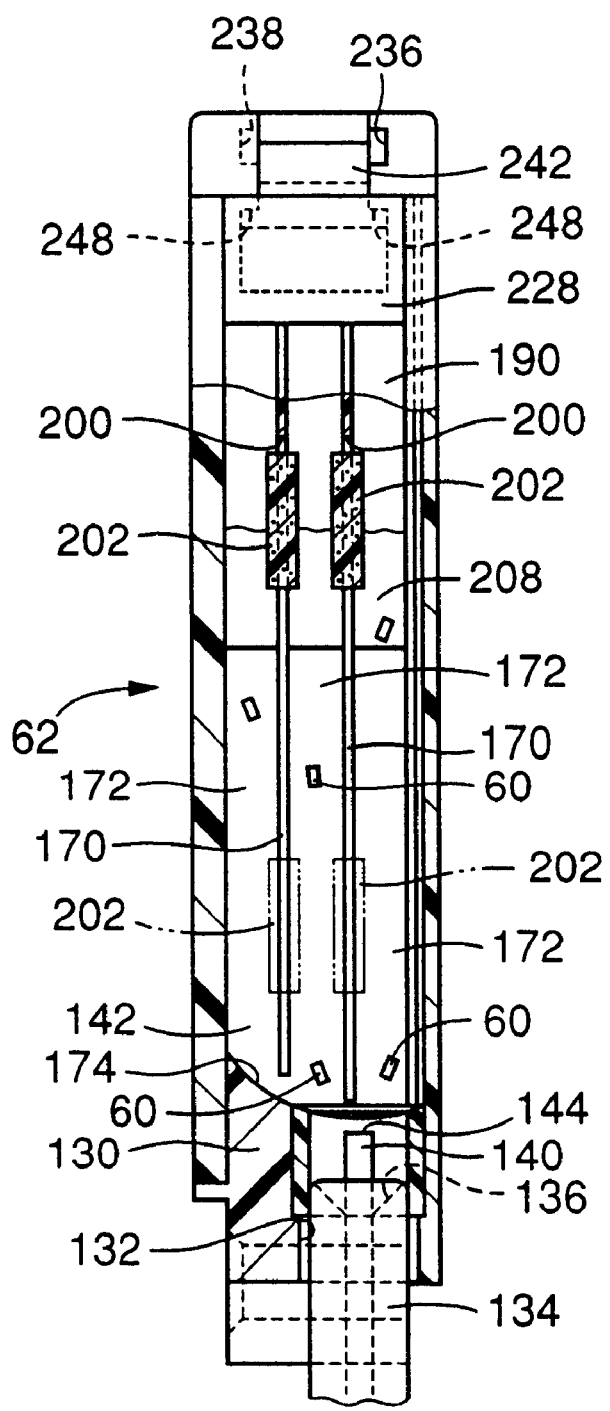
FIG. 4 is a partly cross-sectioned, side elevation view of the case of FIG. 3.

The case 62 is formed of a synthetic resin which is provided with a countermeasure against static electricity, e.g., mixed with an antistatic agent. The case 62 is provided by an integral assembly consisting of a plurality of members, for the convenience of production thereof. As shown in FIGS. 3 and 4, the case 62 has a flat shape having a small width and a great length, as seen in a vertical direction. The case 62 is detachably attached to the second member 74 such that the lengthwise direction of the case 62 is parallel to the EC-feed direction. A bottom portion 130 of the case 62 has, at a position off-set from a widthwise center thereof, a through-hole 132 which is formed vertically through the thickness thereof, and an EC-discharge promoting tube 134 as a chip-discharge promoting member is fitted in the through-hole 132 such that the EC-discharge promoting tube 134 is slideable vertically in the through-hole 132.

The EC-discharge promoting tube 134 has a cylindrical shape with a circular cross section, and has an inner through-hole with a circular cross section. An upper end surface of the promoting tube 134 is so inclined as to be inclined downward in radially inward directions. Thus, the upper end surface of the tube 134 provides a guide surface 136 having a truncated conical shape. In other words, an upper end portion of the tube 134 has a funnel-like shape. A pipe 140 as a guide member having a circular cross section is fitted in the inner through-hole of the promoting tube 134, such that the pipe 140 is movable relative to the tube 134. The pipe 140 is provided upright on the frame body 70, such that the pipe 140 is vertically immovable. An upper end portion of the pipe 140 is located in the vicinity of an open end of the through-hole 132 that opens in an inner space 142 of the case 62, and a lower end portion of the pipe 140 extends to a position near the belt 76. An open end of the pipe 140 that opens toward the inner space 142 provides an outlet 144, and the ECs 60 stored in the case 62 are discharged through the outlet 144 of the case 62. Thus, the case 62 has the outlet 144 in the bottom portion 130 thereof, and the EC-discharge promoting tube 134 is provided in the vicinity of the outlet 144 such that the tube 134 is concentric with the outlet 144. The main frame 70 has a guide passage 146 whose one end is communicated a lower end portion of the pipe 140 and whose other end opens on the belt 76. The EC-discharge promoting tube 134 may be provided by a tube having a rectangular cross section, and the pipe 140 may be one which has a rectangular cross section.

As shown in FIG. 3, one end portion of a drive lever 150 which is pivotally attached to the second member 74, is engaged with the EC-discharge promoting tube 134. The other end portion of the drive lever 150 is biased by a compression coil spring 152 provided between the lever 150 and the main frame 70, in a direction in which the other end portion engages the link 94. The EC-discharge promoting tube 134 is biased by a compression coil spring 154 provided between the tube 134 and the case 62, in a downward direction in which the tube 134 engages the drive lever 150.

Therefore, when the link 94 of the EC feeding device 64 is lowered, the drive lever 150 is pivoted, as indicated at two-dot chain line, against the biasing force of the spring 152, so that the EC-discharge promoting tube 134 is elevated against the biasing force of the spring 154. Thus, the promoting tube 134 is moved up to an upper-end position thereof, indicated at two-dot chain line in FIG. 3, where the upper end portion of the tube 134 projects over the outlet 144 into the inner space 142. That is, the guide surface 136 projects out of the outlet 144 by a distance corresponding to two ECs 60. Meanwhile, when the link 94 is elevated, the drive lever 150 is pivoted by the biasing force of the spring 152, and the tube 134 is lowered to follow the lever 150, by the biasing force of the spring 154. The drive lever 150 and the springs 152, 154 cooperate with one another to provide an EC-discharge-promoting-tube drive device 156 as a chip-discharge-promoting-member drive device. The promoting-tube drive device 156 and the EC feeding device 64 share the drive source and the drive member, and accordingly the total number of parts needed to produce the two devices 156, 64 is reduced as such. This contributes to simplifying the construction of each chip feeder 12.

A plurality of (e.g., two) stationary partition plates 170 are provided in the inner space 142 of the case 62. As shown in FIGS. 3 and 4, the two partition plates 170 extend, in the inner space 142, parallel to each other in the lengthwise direction of the case 62, such that the two plates 170 are distant from each other in the widthwise direction of the case 62. Thus, the inner space 142 is parted into a plurality of (e.g., three) rooms 172. Each of the two partition plates 170 is supported on a bottom surface 174 of the case 62.

As shown in FIG. 3, the bottom surface 174 of the case 62 is inclined downward in respective directions from lengthwise opposite ends thereof toward a central portion thereof, and inclined symmetrically with respect to a plane perpendicular to the lengthwise direction of the case 62. In addition, as shown in FIG. 4, one end of the bottom surface 174 that is distant from the outlet 144 in the widthwise direction of the case 62, has a level higher than that of the outlet 144, and the bottom surface 174 is defined by a part-cylindrical curved surface which is downwards convex toward the outlet 144. Therefore, respective lower portions of the two stationary partition plates 170 are so inclined, as shown in FIG. 3, as to correspond to the bottom surface 174, so that the plates 170 are supported on the bottom surface 174. In addition, as shown in FIG. 4, one of the two plates 170 is somewhat shorter than the other plate 170. Four side surfaces of the case 62 are vertical.

Figure 5:
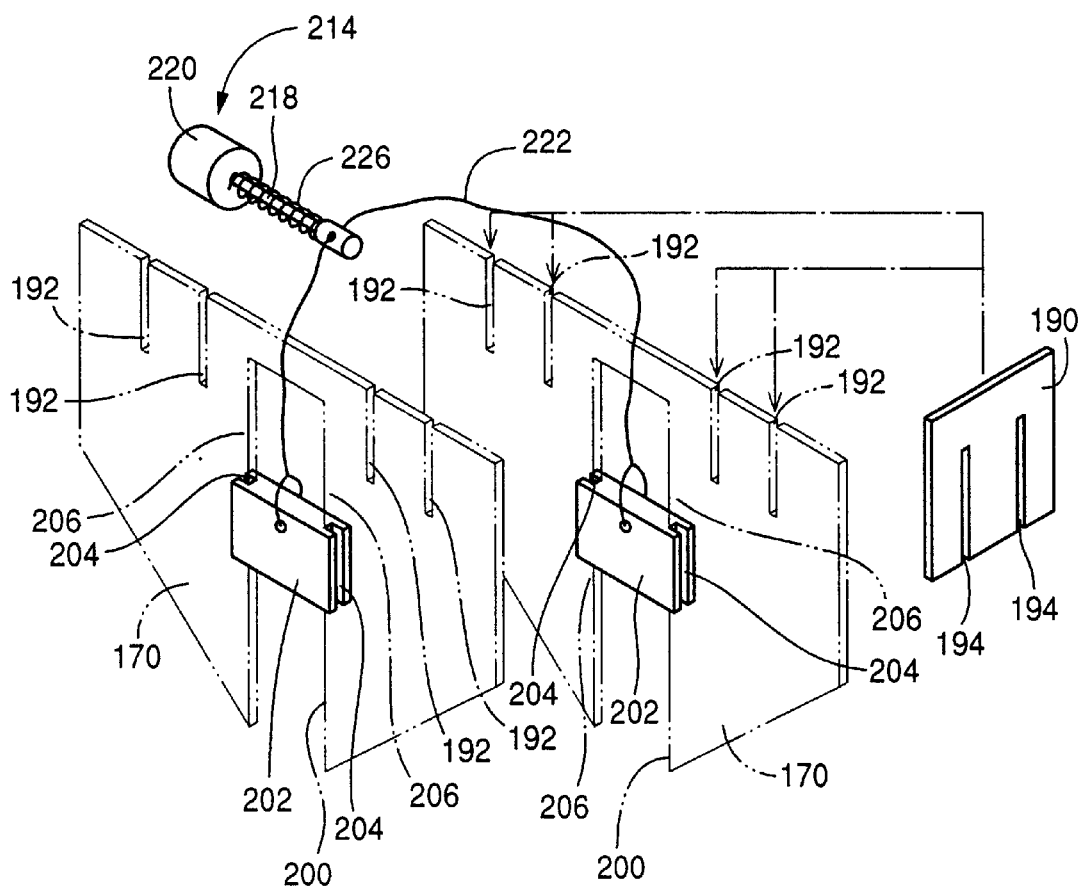
FIG. 5 is a perspective view of stationary partition plates, movable partition plates, and connecting plates all of which are provided in the case of FIG. 3, and a lifting device which lifts up the movable partition plates.
Figure 6:
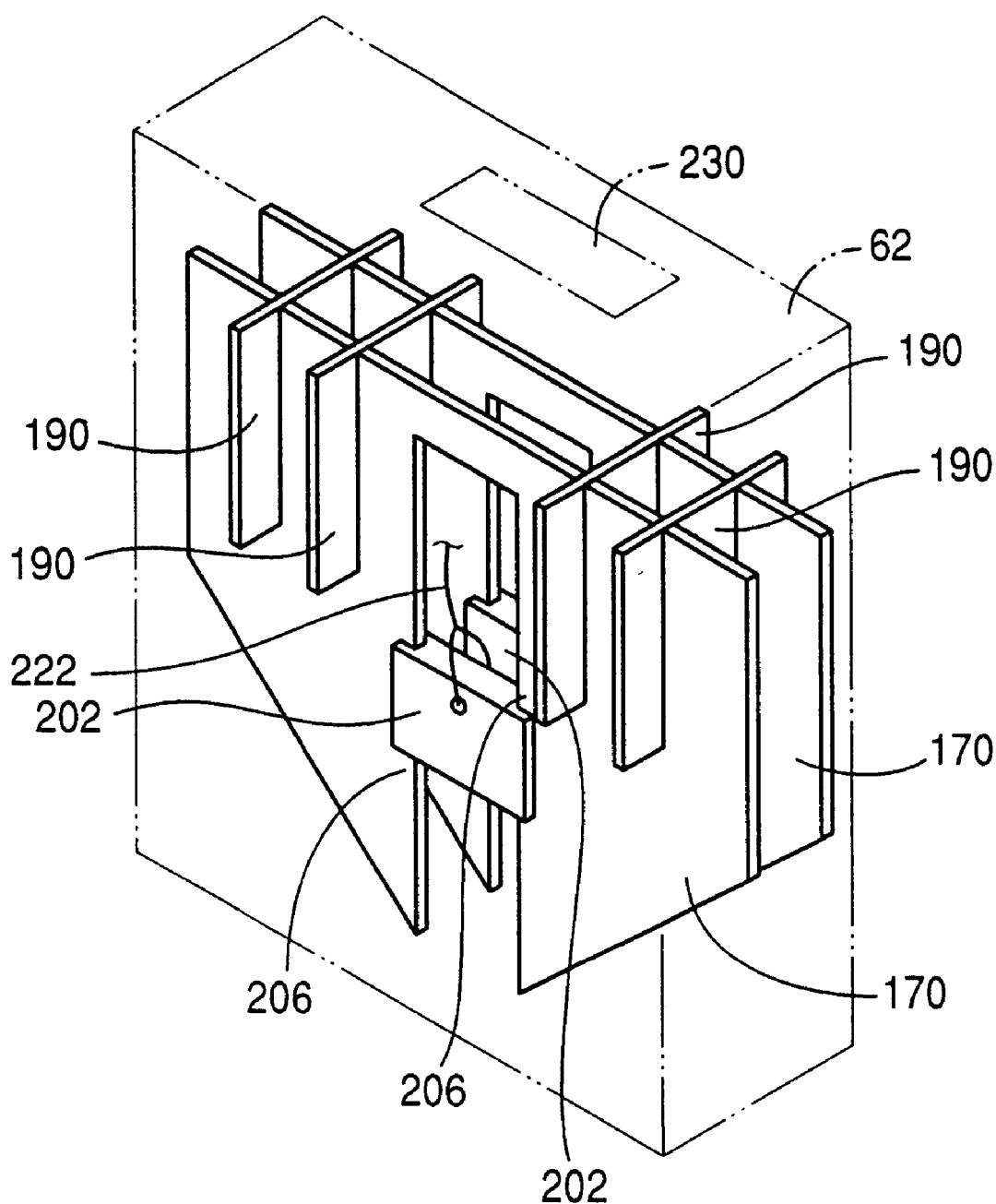
FIG. 6 is a perspective view of the stationary partition plates, the movable partition plates, and the connecting plates all of which are provided in the case.

As shown in FIGS. 5 and 6, a plurality of (e.g., four) connecting plates 190 connect the two stationary partition plates 170 to each other. As shown in FIG. 5, each of the two partition plates 170 has four slits 192 which extend downward from an upper end thereof, and each of the four connecting plates 190 has two slits 194 which extend upward from a lower end thereof. The slits 194 of the connecting plates 190 are fitted in the slits 192 of the partition plates 170, so that the connecting plates and the partition plates 170 are combined with each other.

As shown in FIG. 3, each of the two stationary partition plates 170 has an opening 200 which extends upward from the lower end thereof and which communicates the two rooms 172 located on both sides of the each plate 170, with each other. The opening 200 does not reach the upper end of the each plate 170. The opening 200 has a width greater than the diameter of the EC-discharge promoting tube 134, and is located above the tube 134. Each of the two stationary partition plates 170 is provided with a movable partition plate 202 as a movable partition member, such that the movable partition plate 202 extends across the opening 200 and is movable up and down. As shown in FIG. 5, each of the two movable partition plates 202 has two grooves 204 which are formed in opposite end surfaces thereof to extend vertically. Two edge portions 206 of each stationary partition plate 170 that cooperate with each other to define the opening 200, are fitted in the two grooves 204 of the corresponding movable partition plate 202, respectively, so that the movable partition plate 202 is slideable along the edge portions 206 defining the opening 200.

Each of the two movable partition plates 202 is provided by a solid member formed of a synthetic resin containing metallic power, and has a specific gravity smaller than that of a mass 208 of the ECs 60 stored in bulk in the inner space 142 of the case 62. Each of the ECs 60 includes a ceramic main body and metallic electrodes. In the state in which a number of ECs 60 are stored loosely, i.e. in bulk in the case 62, there are small spaces among the ECs 60, so that the specific gravity of the mass 208 of the ECs 60 is not equal to that of the ECs 60 but equal to an average of that of the ECs 60 and that of those small spaces. The specific gravity of each movable partition plate 202 can be controlled by adjusting the amount of the metallic powder used to produce the each plate 202, so that the specific gravity of the each plate 202 is smaller than that of the mass 208, and so that the each plate 202 floats on the mass 208 such that a lower half portion of the each plate 202 sinks in an upper portion of the mass 208 and an upper half portion of the each plate 202 projects upward from the mass 208. In the present embodiment, the technical feature that the specific gravity of the each plate 202 is smaller than that of the mass 208, provides a movable-partition-member control device. FIGS. 3 and 4 show only some ECs 60 as representatives of the mass 208, and FIG. 4 shows a state in which respective upper end portions of side walls 216 of the case 62 are removed and the case 62 is cross-sectioned by a vertical plane passing through the movable partition plates 202.

As shown in FIGS. 3 and 5, the case 62 is provided with a lifting device 214 which can lift, irrespective of which position or level the upper surface of the mass 208 of chips currently takes, the two movable partition plates 202 up to their upper-end positions where the two movable partition plates 202 contact respective portions of the two stationary partition plates 170 that define respective upper ends of the corresponding openings 200, and cannot further move upward. The lifting device 214 includes an operable rod 218 as an operable member that is supported by the rear side wall 216 of the case 62 such that the operable rod 218 is slideable in a direction parallel to the lengthwise direction of the case 62 and projects rearward from the rear side wall 216 of the case 62. A knob 220 is provided on a portion of the operable rod 218 that projects rearward from the case 62, and a silk gut 222 as a cord is passed through a free end portion of the rod 218 that is located in the case 62, such that the silk gut 222 is movable relative to the rod 218 and opposite ends of the silk gut 222 are connected to the two movable partition plates 202, respectively. The silk gut 222 has a flexibility, a strength that enables the silk gut 222 to lift up the two movable partition plates 202, and a length that allows the two movable partition plates 202 to move up and down and define respective lower-end positions of the two plates 202 where the two plates 202 do not interfere with the EC-discharge promoting member 134 being at its upper-end position. The silk gut 222 is guided by a guide member 224 fixed to a ceiling 228 of the case 62. In FIG. 5, the guide member 224 is not shown. The operable rod 218 is biased by a compression coil spring 226 in a direction in which the rod 218 is moved into the case 62.

As shown in FIG. 3, the ceiling 228 of the case 62 has an aperture which is formed vertically through the thickness thereof and which communicates the inner space 142 with an outer space. The ceiling 228 additionally has a shutter groove 232 extending parallel to the lengthwise direction of the case 62, and a shutter 234 is fitted in the shutter groove 232 such that the shutter 234 is slideable in the groove 232 to open and close the aperture 230.

Figure 7A:
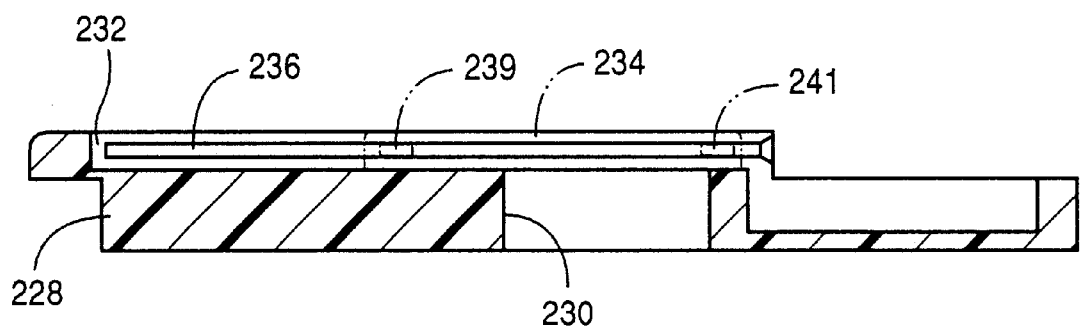
FIG. 7A is a cross-sectioned, front elevation view of a first guide groove formed in a shutter of the case of FIG. 3.
Figure 7B:
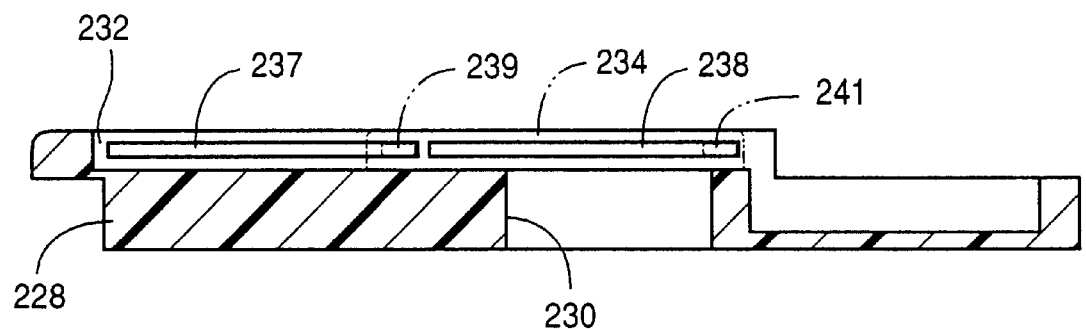
FIG. 7B is a cross-sectioned, front elevation view of a second and a third guide groove formed in the shutter of the case of FIG. 3.

As shown in FIG. 7A, a first guide groove 236 extending parallel to the lengthwise direction of the case 62 is formed in one of opposed side surfaces that cooperate with each other to define the shutter groove 232. A rear end of the first guide groove 236 opens for the reason described later. The rear end of the first guide groove 236 is nearer than the front end thereof to the shutter 234 closing the aperture 230. As shown in FIG. 7B, a second and a third guide groove 237, 238 extending in series parallel to the lengthwise direction of the case 62 are formed in the other of the opposed side surfaces that define the shutter groove 232. The shutter 234 has, on each of opposite side surfaces thereof, two guided projections 239, 241, indicated at two-dot chain line, at respective positions distant from each other in the lengthwise direction of the case 62. The two guided projections 239, 241 provided on one of the opposite side surfaces of the shutter 234 are fitted in the first guide groove 236, and the two guided projections 239, 241 provided on the other side surface of the shutter 234 are fitted in the second and third guide grooves 237, 238, respectively, so that the shutter 234 is movable in the shutter groove 232. The shutter 234 is biased by a compression coil spring 240 in a direction in which the shutter 234 closes the aperture 230. The limit of movement of the shutter 234 by the biasing action of the spring 240 is defined, as shown in FIG. 7B, by butting of the guided projection 239 on a rear end of the second guide groove 237, that is, a front surface of a partition wall located between the second and third guide grooves 237, 238. In this state, the aperture 230 is closed by the shutter 234, as shown in FIG. 3.

A locking member 242 is fitted in the ceiling 228 of the case 62, such that the locking member 242 is vertically movable. The locking member 242 is biased by a compression coil spring 244 provided between the locking member 242 and the ceiling 228, in a direction in which the locking member 242 projects upward from the ceiling 228. The limit of movement of the locking member 242 by the biasing action of the spring 244 is defined by engagement of two engagement portions 246 of the locking member 242 with two shoulder surfaces 248 (FIG. 4) of the ceiling 228, respectively. In this state, an upper surface of the locking member 242 is substantially flush with an upper surface of the shutter 234. When the ECs 60 stored in the case 62 have been completely consumed, or decreased near to zero, an EC replenishing tank 250 (FIG. 3) is set on the case 62, so that new ECs 60 are charged into the case 62 through the aperture 230. The EC replenishing tank 250 has a guided projection 252 on one side surface thereof which is opposed to the guide groove 236 when the tank 250 is attached to the case 62 in the manner described later. The guided projection 252 of the tank 250 can be fitted in the guide groove 236, so that the tank 250 can be moved by being guided by the groove 236. The EC replenishing operation will be described later. Each of the springs 100, 110, 152, 154, 226, 240, 244 functions as an elastic member as a sort of biasing device or member.

The present EC supplying system is controlled by a control device 270 shown in FIG. 1. The control device 270 includes a computer as an essential element thereof, and controls the index servomotor 26, the X-axis servomotor 50, and other elements.

When the EC mounting machine constructed as described above mounts the ECs 60 on the PCB 18, the X-axis table 44 is moved, and the respective EC-supply portions of the chip feeders 12 are sequentially positioned at the EC-supply position to supply the ECs 60 to the EC mounting system 14. As described previously, when the link 94 of each chip feeder 12 is lowered, the chip feeder 12 prepares for moving the belt 76, i.e., feeding the ECs 60. When the main lever 92 is pivoted for preparing the feeding of the ECs 60, the drive lever 150 is also pivoted for elevating the EC-discharge promoting tube 134, so that the upper end portion of the promoting tube 134 projects into the inner space 142 of the case 62, as indicated at two-dot chain line in FIG. 3. This elevation of the promoting tube 134 and the elevation of the ECs 60 due to the elevation of the tube 134 are permitted by the openings 200 of the two stationary partition plates 170. The elevation and lowering (i.e., upward and downward movements) of the tube 134 are repeated.

The repeated elevation and lowering of the EC-discharge promoting tube 134 avoids the "bridge" phenomenon that some ECs 60 around the outlet 144 engage one another and prevent each other from moving into the outlet 144. Since some ECs 60 in contact with the tube 134 and other ECs 60 in contact with those ECs 60 are moved by the tube 134, the "bridge" of ECs 60 is not formed around the outlet 144. Thus, the discharging of the ECs 60 through the outlet 144 is promoted. That is, the repeated upward and downward movements of the promoting tube 134 promotes the discharging of the ECs 60 through the outlet 144.

When the EC-discharge promoting tube 134 is moved upward, the upper end of the promoting tube 134 projects into the inner space 142 by a distance substantially equal to two ECs 60, thereby generating a passage which introduces the ECs 60 into the outlet 144. Thus, one or two ECs 60 around the upper end of the tube 134 enters or enter the tube 134. If there is any vacant space in the pipe 140, the ECs 60 enter the pipe 140 via the outlet 144. The ECs 60 in the pipe 140 pass through the guide passage 146 formed in the main frame 70, and then ride on the belt 76. When the belt 76 is moved, the ECs 60 are fed toward the EC-supply portion of the chip feeder 12. If the pipe 140 is filled with the ECs 60 and accordingly no additional ECs 60 can enter the pipe 140, the ECs 60 in the upper end portion of the promoting tube 134 come out of the tube 134 when the tube 134 is moved downward.

After one EC-suction head 22 takes one EC 60 from one chip feeder 12, the link 94 is moved upward, and the belt 76 is moved forward, so that the ECs 60 on the belt 76 are fed forward. Concurrently, the drive lever 150 is pivoted by the biasing action of the spring 152, so that the EC-discharge promoting tube 134 is moved downward.

Each time one chip feeder 12 supplies a predetermined number of ECs 60 to the EC mounting system 14, the X-axis table 44 is moved to position the EC-supply portion of another chip feeder 12 which is next to supply ECs 60, at the EC-supply position. When the X-axis table 44 starts or stops moving, all the chip feeders 12 are accelerated and decelerated so that the mass 208 of ECs waves in the case 62 of each of the feeders 12. The ECs 60 present in the lower portion of the mass 208 of ECs bind one other and accordingly can hardly move, but the ECs 60 present in the upper portion of the mass 208 of ECs can easily move, and accordingly collide with one other or with the case 62 or stationary partition plates 170, or are subjected to friction with one another. However, since the inner space 142 of the case 62 are parted into the three rooms 172 by the two stationary partition plates 170, the ECs 60 can move a short distance only and can gain a small kinetic energy only. Thus, the damaging of the ECs 60 resulting from the collision and/or friction thereof is minimized. Accordingly, the ECs 60 can be advantageously soldered to the PCB 18.

The two rooms 172 on both sides of each of the two stationary partition plates 170 are communicated with each other via the opening 200 of the each plate 170. Thus, the ECs 60 can move between those two rooms 172. However, the movement of the ECs 60 present in the upper portion of the mass 208 of ECs is limited by the movable partition plate 202 associated with the each plate 170. Thus, the ECs 60 present in the upper portion of the mass 208 of ECs can move a short distance only like the ECs 60 which are not aligned with the opening 200. Each of the two movable partition plates 202 floats on the mass 208 of ECs such that the lower portion of the each plate 202 sinks in the upper portion of the mass 208 of chips and the upper portion of the each plate 202 projects upward from the mass 208. Therefore, each movable partition plate 202 inhibits the movement of the ECs 60 present in a portion of the mass 208 of chips that corresponds to a depth of sinking of the each plate 202 in the mass 208. Consequently the ECs 60 can gain a small kinetic energy only and the damaging of the ECs 60 resulting from the collision thereof with one another or with the case 62 can be minimized. Even in the case where only a single stationary partition plate 170 is provided in the case 62, the ECs 60 can gain only a less kinetic energy than that gained by the ECs 60 in the case where no stationary partition plate 170 is provided in the case 62. Thus, the chip feeders 12 exhibit an EC-damaging reducing effect to some degree. However, if each chip feeder 12 employs two stationary partition plates 170, the ECs 60 can gain a much less kinetic energy only, and the chip feeders 12 exhibit an EC-damaging reducing effect to much higher a degree.

Since the respective lower ends of the stationary partition plates 170 are supported on the bottom surface 174 of the case 62 and accordingly no space is left between the plates 170 and the bottom surface 174, the ECs 60 are prevented from being pinched between the plates 170 and the bottom surface 174 and thereby damaged.

The ECs 60 present below each of the two movable partition plates 202 can move between the two rooms 176 on both sides of the corresponding stationary partition plate 170, via the opening 200 of the plate 170. As the ECs 60 are discharged through the pipe 140, the ECs 60 moves toward the outlet 144 by being guided by the inclined bottom surface 174 of the case 62. As each chip feeder 12 continues to feed the ECs 60 and supply the same 60 to the EC mounting system 14, the number of ECs 60 stored in the case 62 decreases and the depth of the mass 208 of ECs decreases, so that the level of the upper surface of the mass 208 of ECs lowers. Accordingly, each movable partition plate 202 lowers, as indicated at two-dot chain line in FIG. 3, while maintaining the state in which the lower half portion of the each plate 202 sinks in the upper portion of the mass 208 of ECs and the upper half portion of the same 202 projects upward from the mass 208. Thus, the movable partition plates 202 continue to limit the movement of the ECs 62 when the X-axis table 44 is moved and stopped.

The two movable partition plates 202 move down to the respective lower-end positions thereof which are defined by the length of the silk gut 222. The plates 202 being at their lower-end positions do not interfere with the EC-discharge promoting tube 134 being at its upper-end position. However, even if the promoting tube 134 may be moved up to butt the movable partition plates 202, the silk gut 222 permits the plates 202 to be moved up by the tube 134. Thus, the ECs 60 are prevented from being damaged by being pinched between the tube 134 and the plates 202.

Since each movable partition plate 202 cannot be further moved downward from its lower-end position, the plate 202 cannot limit the movement or waving of the ECs 60 in a state in which the amount of the ECs 60 remaining in the case 62 decreases to such a degree that the upper surface of the mass 208 of ECs is located below the plate 202 being at its lower-end position. However, usually, each chip feeder 12 does not continue to supply the ECs 60 till the amount of the remaining ECs 60 decreases to that degree. Before the amount of the remaining ECs 60 decreases to the degree that the movable partition plates 202 cannot limit the waving of the ECs 60, the operator replenishes the chip feeder 12 with new ECs 60. Even if the operator may not replenish each chip feeder 12 with new ECs 60 till the amount of the ECs 60 remaining in the case 62 decreases to that degree, then the number of the remaining ECs 60 is small and accordingly those ECs 60 are discharged in a short time. That is, the waving of the ECs 60 does not last so long, with no problem.

Figure 8A:
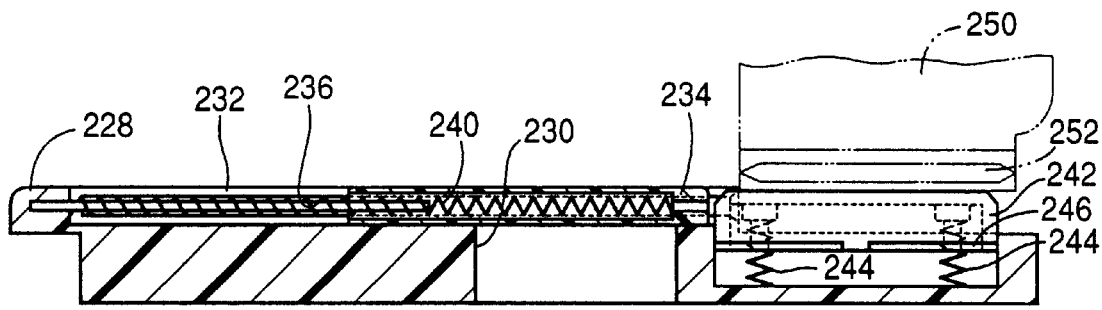
FIG. 8A is a cross-sectioned, front elevation view for explaining a first step of an EC-replenishing-tank attaching operation.
Figure 8B:
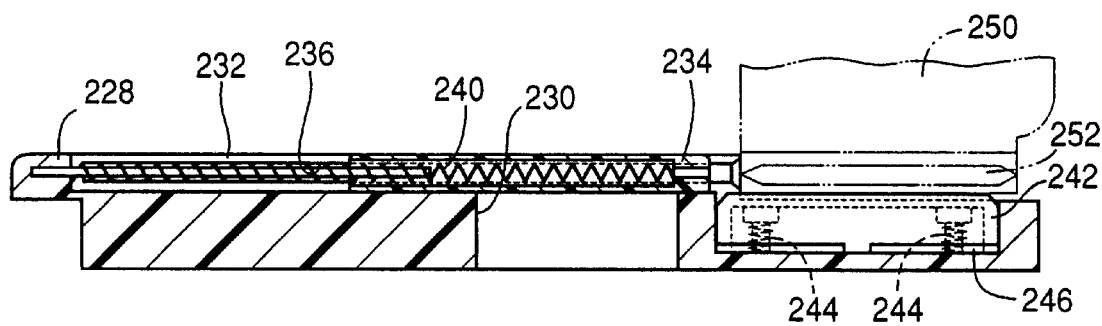
FIG. 8B is a cross-sectioned, front elevation view for explaining a second step of the EC-replenishing-tank attaching operation.

When the number of the ECs 60 remaining in the case 62 of each chip feeder 12 decreases to such a degree that the feeder 12 needs replenishing of new ECs 60, or when the number decreases to zero, the operator replenishes the case 62 with new ECs 60. FIG. 8A shows the state in which the EC-replenishing tank 250 is not attached to the case 62. In this state, the shutter 234 is biased by the spring 240 to close the aperture 230, and the guided projection 239 of the shutter 234 is held in butting contact with the rear end of the second guide groove 237 (FIG. 7B). There remains a small clearance between the shutter 234 and the locking member 242. When the operator replenishes the case 62 with new ECs 60, first, he or she places the EC-replenishing tank 250 in which new ECs 60 are stored, on the locking member 242, as shown in FIG. 8A. Then, as shown in FIG. 8B, the operator pushes the locking member 242 via the tank 250 against the biasing force of the spring 244 till the guided projection 252 of the tank 250 is aligned with the first guide groove 236 formed in the ceiling 238.

Figure 8C:
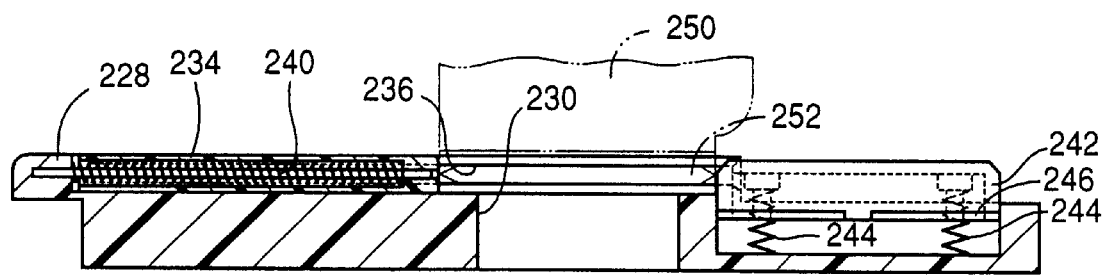
FIG. 8C is a cross-sectioned, front elevation view for explaining a third step of the EC-replenishing-tank attaching operation.

Subsequently, the operator moves the EC-replenshing tank 250 in a direction toward the shutter 234, thereby moving the shutter 234 against the biasing force of the spring 240. Since the rear end of the first guide groove 236 opens in the atmosphere, the guided projection 252 of the tank 250 can enter the groove 236, so that the movement of the tank 250 is guided by the cooperation of the guided portion 252 and the guide groove 236. The movement of the shutter 234 is guided by the cooperation of the guided projections 239, 241 and the guide grooves 237, 238. Thus, the guided projections 239, 241 as guided portions and the guide grooves 236, 237, 238 as guide portions cooperate with each other to provide a guide device which guides the movements (i.e., opening and closing movements) of the shutter 234, and the guided projection 252 as a guided portion and the guide groove 236 as a guide portion cooperate with each other to provide a guide device which guides the movements of the tank 250. When the shutter 234 and the tank 250 are moved in this way, the aperture 230 is opened, as shown in FIG. 8C, and the tank 250 is moved away from the locking member 242 and is positioned above the aperture 230. In this state, the locking member 242 is moved upward by the biasing force of the spring 244, and the tank 250 is pressed against the locking member 242 via the shutter 234 by the biasing force of the spring 240, and is sandwiched between the shutter 234 and the locking member 242. Even if the operator removes his or her hands off the tank 250, the tank 250 does not come off the case 62. That is, the tank 250 is locked by the locking member 242.

In the state in which the EC-replenishing tank 250 is sandwiched between the shutter 234 and the locking member 242, a mouth (not shown) of the tank 250 is aligned with the aperture 230 of the case 62. However, the mouth of the tank 250 remains closed when the tank 250 is attached to the case 62. After the attaching operation, the operator operates the knob 220 of the lifting device 214, i.e., pulls the operable rod 218 against the biasing force of the spring 226, thereby lifting up the two movable partition members 202. Subsequently, the operator opens the mouth of the tank 250. As a result, the ECs 60 stored in the tank 250 flow into the the case 62. After the replenishing of the case 62 with the ECs 60 is finished, the operator releases the operable rod 218, so that the rod 218 is drawn into the case 62 by the biasing force of the spring 226. However, since the case 62 has been filled with the ECs 60, the movable partition plates 202 do not lower and float on the mass 208 of ECs such that the lower half portion of each plate 202 sinks in the upper portion of the mass 208 and the upper half portion of the same 202 projects upward from the mass 208. Thus, the movable partition plates 202 limit the waving of the ECs 60 present in the upper portion of the mass 208 of ECs. The silk gut 222 is loosened and accordingly permits the plates 202 to float on the mass 208 of ECs.

Finally, the operator pushes down the locking member 242 against the biasing force of the spring 244, draws the EC-replenishing tank 250 onto the locking member 242, and removes the tank 250 off the locking member 242. As the tank 250 is drawn out, the shutter 234 is moved by the biasing force of the spring 240 to follow the tank 250, thereby closing the aperture 230. After the tank 250 is drawn out onto the locking member 242, the operator removes the tank 250 off the locking member 242. Then, the locking member 242 is moved up by the biasing force of the spring 244.

Next, there will be described a second embodiment of the present invention, by reference to FIGS. 9 and 10. The second embodiment relates to a chip feeder 300 which employs a single stationary partition plate 170, and a single movable partition plate 302 which is slideably fitted on the stationary partition plate 170 and which includes a pair of lateral projections 304 functioning as the movable-partition-member control device. Like each of the movable partition plates 202, the movable partition plate 302 has a pair of grooves 204 in which two opposed edges 206 of the stationary partition plate 170 that cooperate with each other to define an opening 200 are fitted, respectively, so that the movable plate. 302 is slideable in a substantially vertical direction. However, the movable partition plate 302 is formed of a metal such as steel, unlike the each plate 202.

The two lateral projections 304 project laterally from opposite side surfaces of the movable partition plate 302, respectively. The lateral projections 304 has a specific gravity smaller than that of a mass 208 of ECs, and is formed of a material, such as a synthetic resin or a foamed material (e.g., polystyrene foam), which can cause the movable partition plate 302 to float on the mass 208 of ECs such that a lower half portion of the plate 302 sinks in an upper portion of the mass 208 and an upper, half portion of the plate 302 projects upward from the mass 208. The lateral projections 304 float on the mass 208 of ECs and accordingly the movable partition plate 302 floats on the mass 208 in the above-indicated manner, so that the plate 302 limits the waving of the ECs 60 when the chip feeder 300 is moved and stopped.

Figure 9:
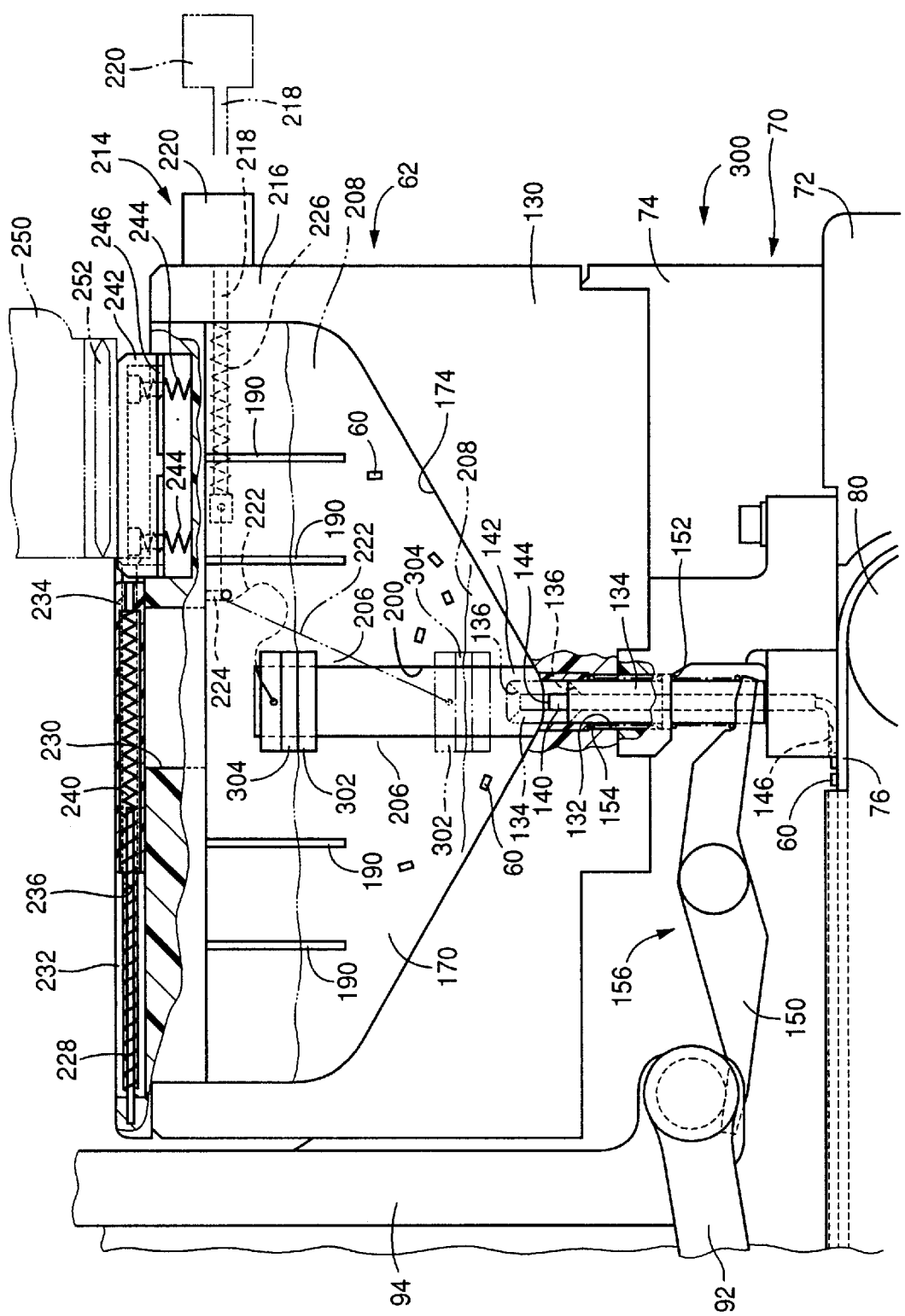
FIG. 9 is a partly cross-sectioned, front elevation view of a case of another chip feeder as a second embodiment of the present invention.
Figure 10:
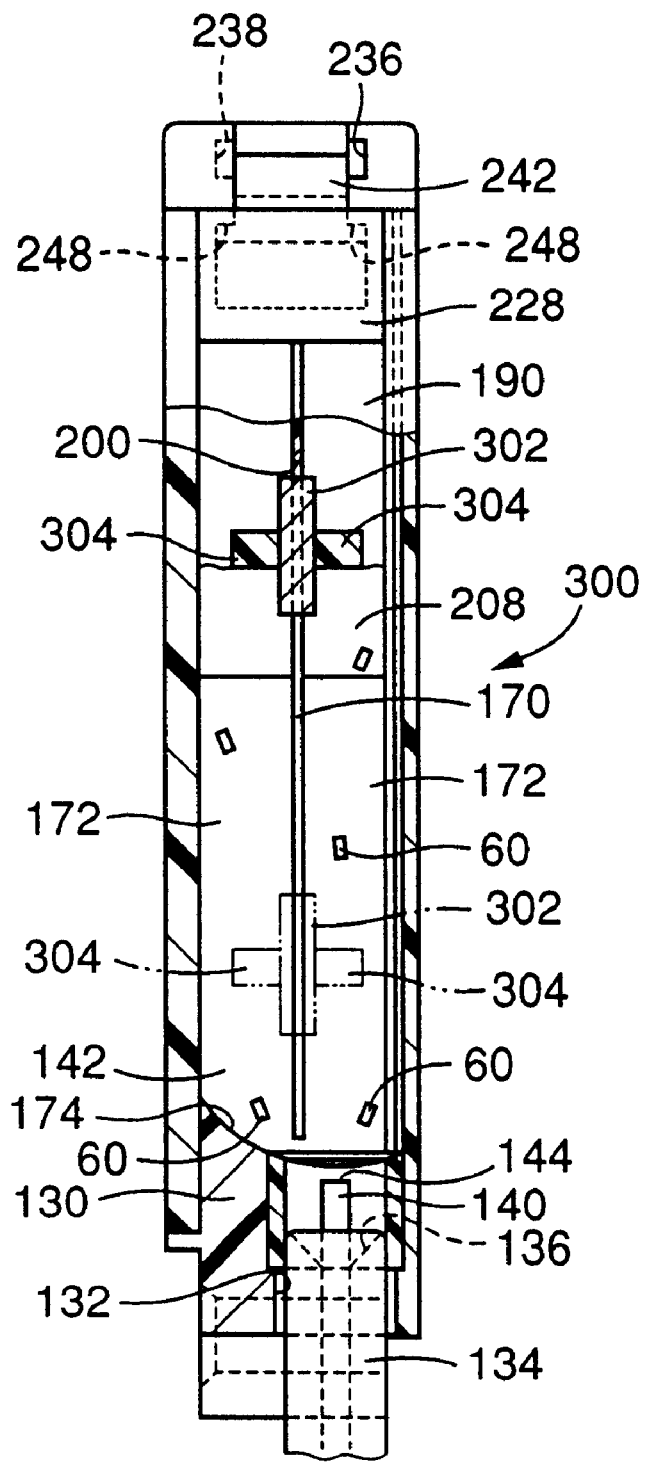
FIG. 10 is a partly cross-sectioned, side elevation view of the case of FIG. 9.

All the other features of the second embodiment shown in FIGS. 9 and 10 are the same as those of the first embodiment shown in FIGS. 1 to 8. Accordingly, the same reference numerals as used in the first embodiment are used to designate the corresponding elements of the second embodiment, and the description of those elements is omitted. The chip feeder 300 may employ a plurality of stationary partition plates 170, and a plurality of movable partition plates 302 each of which is slideably fitted on a corresponding one of the stationary partition plates 170 and each of which has a pair of lateral projections 304.

Figure 11:
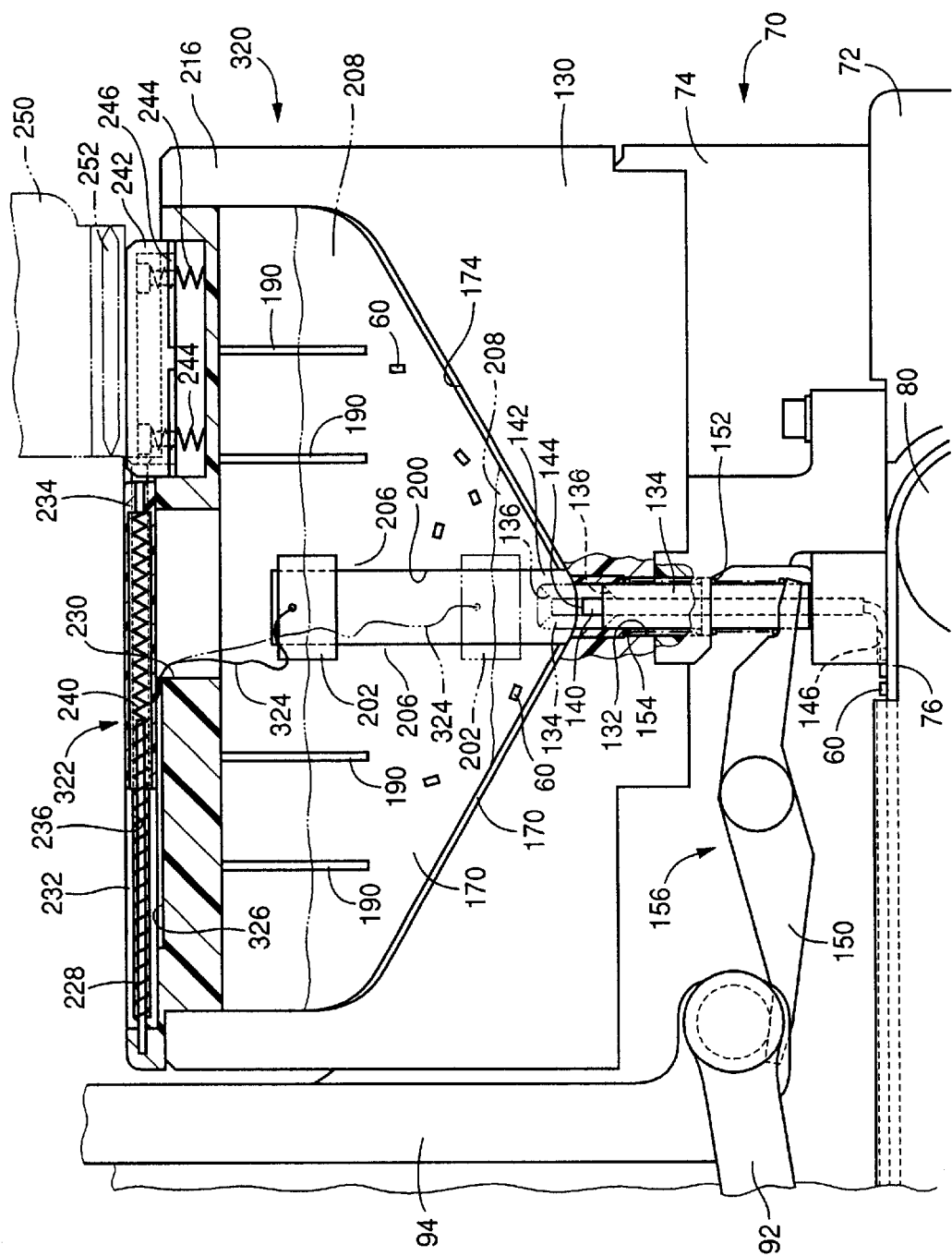
FIG. 11 is a partly cross-sectioned, front elevation view of a case of another chip feeder as a third embodiment of the present invention.

FIG. 11 shows a third embodiment of the present invention that relates to a chip feeder 320 which employs a lifting device 322 which lifts up two movable partition plates 202 when a shutter 234 provided in a ceiling 228 of a case 62 is moved to open an aperture 230. The other features of the third embodiment are the same as those of the first embodiment shown in FIGS. 1 to 8. Accordingly, the same reference numerals as used in the first embodiment are used to designate the corresponding elements of the third embodiment, and the description of those elements is omitted.

A silk gut 324 connects each of the two movable partition plates 202 (only one plate 202 is shown in FIG. 11), to the shutter 234. The ceiling 228 has a groove 326 which accommodates the silk gut 324. The groove 326 extends parallel to a direction in which the shutter 234 is moved, and opens in a bottom surface of a shutter groove 232 which accommodates the shutter 234. The silk gut 324 has a length which permits, in the state in which the shutter 234 fully closes the aperture 230, the movable partition plates 202 to move down to respective lower-end positions thereof where the plates 202 do not interfere with an EC-discharge promoting tube 134 being at an upper-end position thereof, and which permits the shutter 234 to be moved to open fully the aperture 230.

When an operator replenishes the case 62 with new ECs 60, he or she attaches an EC-replenishing tank 250 to the case 62, in a manner described in connection with the first embodiment, and subsequently opens the shutter 234. When the shutter 234 is opened, the silk gut 324 connected to the shutter 234 lifts up the two movable partition plates 202. Since the silk gut 324 is accommodated in the groove 326, the gut 324 is prevented from entering a gap between a lower surface of the shutter 234 and a bottom surface of the shutter groove 232 and thereby stopping the movement of the shutter 234 in the groove 232. Thus, when the tank 250 is attached to the case 62, the movable partition plates 202 are also lifted up. Therefore, the operator need not perform an additional operation for lifting up the plates 202, after the attachment of the tank 250 to the case 62. In the present embodiment, the shutter 234 functions as the operable member of the lifting device 322. In the state in which the case 62 is replenished and filled with new ECs 60, the movable partition plates 202 float on a mass 208 of ECs. Accordingly, if the shutter 234 is moved to close the aperture 230, the silk gut 324 is loosened and is prepared for downward movement of the movable partition plates 202.

Figure 12:
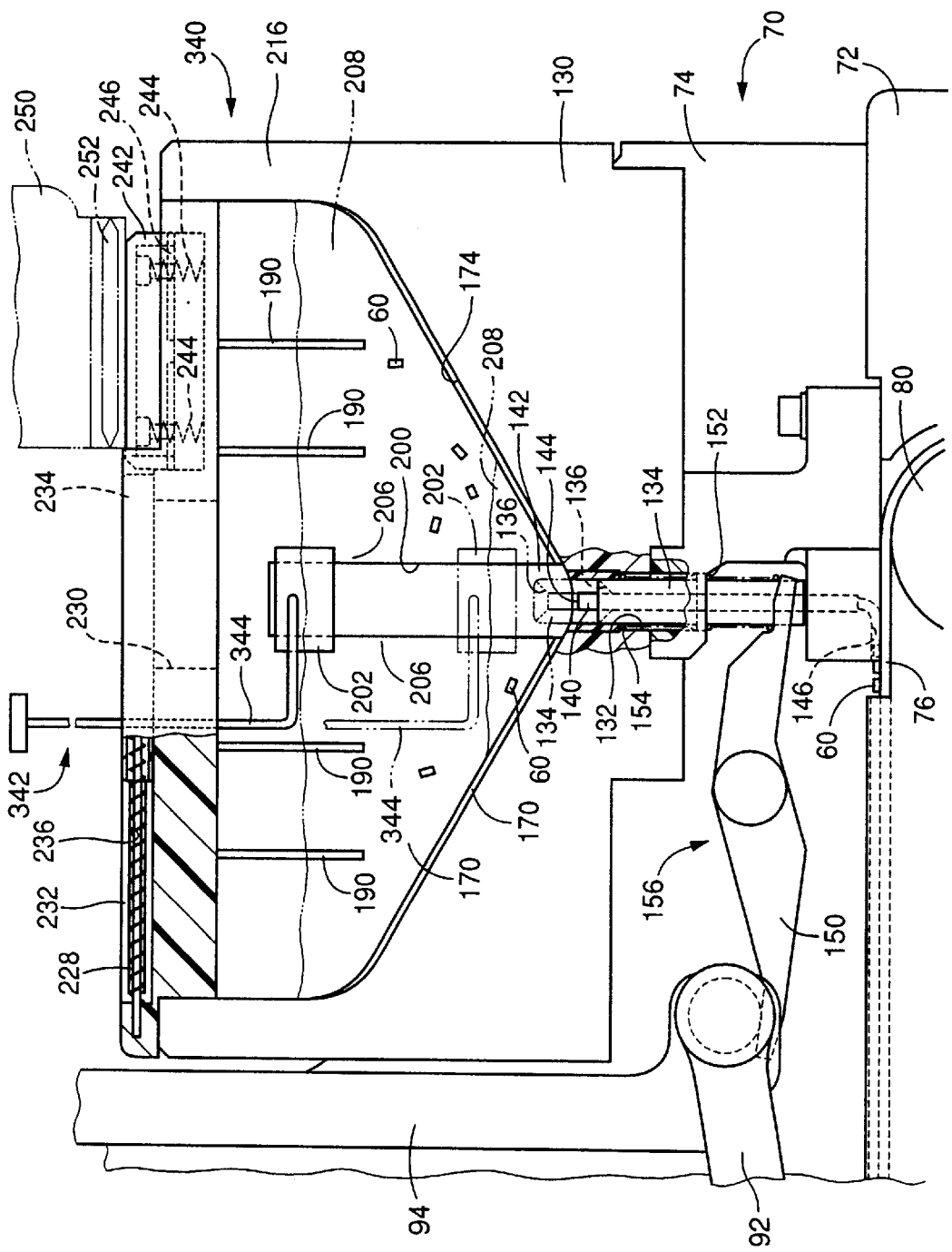
FIG. 12 is a partly cross-sectioned, front elevation view of a case of another chip feeder as a fourth embodiment of the present invention.

FIG. 12 shows a fourth embodiment of the present invention that relates to a chip feeder 340 which employs a lifting device 342 which includes a rod 344 as the operable member thereof. A lower end portion of the rod 344 is fitted in each of two movable partition plates 202, such that the lower end portion passes through the thickness of the each plate 202 in a direction perpendicular to opposite side surfaces of the each plate 202. The other end portion of the rod 344 is fitted in a ceiling 288 of a case 62, such that the other end portion projects upward out of the ceiling 288 and is slideable in an axial direction of an intermediate portion of the rod 344. The rod 344 has a length which permits the movable partition plates 202 to move down to respective lower-end positions thereof where the plates 202 do not interfere with an EC-discharge promoting tube 134 being at an upper-end position thereof. The rod 344 is supported by a portion of the ceiling 228 that assures that the rod 344 does not interfere with the shutter 234. That is, in the present embodiment, the ceiling 228 has such a width which enables the ceiling 228 to support the rod 344 such that the rod 344 does not interfere with the shutter 234. The respective lower-end positions of the two movable partition plates 202 may be defined by butting of a butting portion (not shown) of the rod 344 on an upper surface of the ceiling 228. An apparent or average specific gravity of the rod 344 and the movable partition plates 202 is smaller than a specific gravity of the mass 208 of ECs. The rod 344 is formed of such a material, and formed with such a structure, which enable each of the plates 202 to float on the mass 208 of ECs such that a lower half portion of the each plate 202 sinks in an upper portion of the mass 208 of ECs and an upper half portion of the each plate 202 projects upward from the mass 208.

An operator lifts up the rod 344 before or after the case 60 is replenished with new ECs 60. Thus, the two movable partition plates 202 are lifted up, and float on a mass 208 of the new ECs 60 replenished. As the chip feeder 340 continues to supply the ECs 60 and accordingly the upper surface of the mass 208 of ECs lowers, the movable partition plates 202 lower with the rod 344, as indicated at two-dot chain line in FIG. 12, while limiting the waving of the ECs 60 present in the upper portion of the mass 208 of ECs.

Each of the outer surfaces of the stationary and movable partition plates 170, 202, 302 and the vertical inner surfaces of the case 62 may be covered with a cushion layer, as a sort of shock absorbing member, that is formed of, e.g., rubber or its analogous material. In this case, the cushion layers effectively absorb the shock produced when the ECs 60 collide with the above-indicated surfaces. Each of the stationary partition plates 170 may be entirely covered with the cushion layers, except the two opposed edges 206 which define the opening 200 and on which the corresponding movable partition plate 202 is fitted such that the movable plate 202 is movable relative to the stationary plate 170.

In each of the illustrated embodiments, the ECs 60 discharged from the case 62 are fed to the EC-supply portion of each chip feeder 12 by the EC feeding device 64 including the belt 76. However, each chip feeder 12 may employ a different EC feeding device which does not employ a belt and which utilizes, e.g., an air flow for arranging ECs into an array and feeding the array of ECs to an EC-supply portion thereof. However, each chip feeder 12 need not essentially employ an EC feeding device. For example, each chip feeder 12 may be modified to position each EC at an EC-supply portion thereof by utilizing inclination of a bottom surface on which ECs are placed.

In the case where each EC 60 has a rectangular transverse cross section (i.e., cross section taken along a plane perpendicular to the lengthwise direction of the each EC 60) and the pipe 140 has a circular cross section for guiding the each EC 60, the pipe 140 may be one which has the function of changing an arbitrary angular phase of the each EC 60 with which the each EC 60 has entered the pipe 140, to a reference angular phase with which the each EC 60 is to be fed by the EC feeding device 64. The angular phase of the each EC 60 is defined as an angular phase of the each EC 60 about a central axis line parallel the lengthwise direction of the each EC 60. For example, in the case where the chip feeders 12 supply the ECs 60 to the EC mounting system 14 and the EC feeding device 64 of each chip feeder 12 feeds each EC 60 with a reference angular phase with which the each EC 60 is to be sucked and held by one EC-suction head 22 of the EC mounting system 14, the pipe 140 changes the current angular phase of the each EC 60 to the reference angular phase, so that the each EC 60 with the reference angular phase is transferred from the pipe 140 to the EC feeding device 64. In the case where the pipe 140 has a rectangular transverse cross section like each EC 60, the pipe 140 may be disposed in such a posture which ensures that the each EC 60 enters the pipe 140, with the reference angular phase with which the each EC 60 is to be transferred from the pipe 140 to the EC feeding device 64 and with which the each EC 60 is to be fed by the EC feeding device 64. An angular-phase changing device may be provided in an EC-feed path of the EC feeding device 64, so as to change the current angular phase of each EC 60 which has been transferred with an arbitrary or predetermined angular phase from the pipe 140 to the EC feeding device 64, to a reference angular phase with which the each EC 60 is to be supplied from each chip feeder 12 to the EC mounting system 14.

While the present invention has been described in detail in its preferred embodiments, it is to be understood that the invention is by no means limited to the details of the illustrated embodiments but may be embodied with, in addition to the features (1) to (15) described in the summary of the invention, various features, improvements, and advantages that may occur to one skilled in the art without departing from the scope and spirit of the invention defined in the appended claims.

What is claimed is:

1. A chip feeder for feeding chips stored in bulk in a case thereof, one by one, from a chip-supply portion thereof, the chip feeder comprising:

at least one partition plate which parts a space in the case into a plurality of rooms, the partition plate having an opening which extends in a direction intersecting a horizontal plane and which communicates the respective rooms on both sides of the partition plate, with each other;

at least one movable partition member which extends across the opening of said at least one partition plate and which is movable relative to the opening in said direction intersecting the horizontal plane; and a movable-partition-member control device which controls the movable partition member so that a lower portion of the movable partition member sinks in an upper portion of a mass of the chips stored in bulk in the case and an upper portion of the movable partition member projects upward from the mass of the chips.

2. A chip feeder according to claim 1, wherein the opening of the partition plate extends upward from a lower end thereof.

3. A chip feeder according to claim 1, wherein the movable partition member has two grooves which are formed in opposite end surfaces of the movable partition member, respectively, such that each of the two grooves extends in said direction intersecting the horizontal plane, and wherein the partition plate has two opposed edges which are opposed to each other to define the opening therebetween and which are fitted in the two grooves of the movable partition member, respectively, so that the movable partition member is slideable on the opposed edges defining the opening.

4. A chip feeder according to claim 1, wherein the movable-partition-member control device comprises the movable partition member which has a specific gravity smaller than a specific gravity of the mass of the chips stored in bulk in the case so that the movable partition member floats on the mass of the chips in a state in which the lower portion of the movable partition member sinks in the upper portion of the mass of the chips.

5. A chip feeder according to claim 1, wherein the movable partition member includes at least one projecting portion which projects laterally from a side surface thereof and which has a specific gravity smaller than a specific gravity of the mass of the chips, and wherein the movable-partition-member control device comprises the projecting portion of the movable partition member.

6. A chip feeder according to claim 1, wherein the case comprises a thin case having a thin space therein, and wherein the partition plate extends, in the thin space of the thin case, in a direction parallel to a lengthwise direction of the thin case to part the thin space into a plurality of thin rooms.

7. A chip feeder according to claim 6, comprising a plurality of said partition plates which extend parallel to each other in said thin space of the thin case.

8. A chip feeder according to claim 7, further comprising a plurality of connecting plates each of which extends between the plurality of partition plates to connect the partition plates to each other, each of the partition plates having a plurality of first slits each of which extends downward from an upper end of said each partition plate, each of the connecting plates having a plurality of second slits each of which extends upward from a lower end of said each connecting plate, and wherein the first slits of the partition plates and the second slits of the connecting plates are fitted in each other so that the partition plates and the connecting plates are combined with each other.

9. A chip feeder according to claim 1, wherein the partition plate is provided in the space of the case such that a lower end of the partition plate is supported on a bottom surface of the case.

10. A chip feeder according to claim 1, further comprising a lifting device which lifts the movable partition member upward to an upper-end position thereof, irrespective of a position of an upper surface of the mass of the chips stored in bulk in the case.

11. A chip feeder according to claim 10, wherein the lifting device comprises:

an operable member which is movably supported by the case; and a cord which connects the operable member and the movable partition member to each other.

12. A chip feeder according to claim 11, wherein the case includes a shutter which is movable to open and close the space of the case, and wherein the operable member of the lifting device comprises the shutter.

13. A chip feeder according to claim 1, further comprising a cushion layer which is provided on a surface of at least one of the partition plate and the movable partition member, said surface being exposed to the space of the case.

14. A chip feeder according to claim 1, wherein the case has an outlet, wherein the chip feeder further comprises a chip-discharge promoting member which is provided in vicinity of the outlet of the case and which is movable up and down to promote discharging of the chips from the case through the outlet thereof, and wherein the partition plate has the opening which is provided above the chip-discharge promoting member to permit the chips to be moved up when the chip-discharge promoting member is moved up.

15. A chip supplying system comprising:

a table;

a plurality of chip feeders, each according to claim 1, which are provided on the table such that the respective chip-supply portions of the chip feeders are arranged along a line; and a table moving device which moves the table in a direction parallel to said line to sequentially position each of the respective chip-supply portions of the chip feeders at a predetermined chip-supply position.

* * * * *